(12) United States Patent
Kim et al.

(10) Patent No.: US 10,886,306 B2
(45) Date of Patent: *Jan. 5, 2021

(54) DISPLAY DEVICE WITH OVERLAPPING LINES SPACED APART FROM AN INSULATING LAYER

(71) Applicant: SAMSUNG DISPLAY CO., LTD., Yongin-si (KR)

(72) Inventors: Deuk Jong Kim, Yongin-si (KR); Keun Soo Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 47 days.

This patent is subject to a terminal disclaimer.

(21) Appl. No.: 16/245,670

(22) Filed: Jan. 11, 2019

(65) Prior Publication Data
US 2019/0148413 A1 May 16, 2019

Related U.S. Application Data

(63) Continuation of application No. 15/293,779, filed on Oct. 14, 2016, now Pat. No. 10,192,896.

(30) Foreign Application Priority Data

Apr. 22, 2016 (KR) .................. 10-2016-0049637

(51) Int. Cl.
*H01L 27/12* (2006.01)
*G02F 1/1333* (2006.01)
(Continued)

(52) U.S. Cl.
CPC ........ *H01L 27/1244* (2013.01); *G02F 1/1345* (2013.01); *G02F 1/13458* (2013.01);
(Continued)

(58) Field of Classification Search
CPC ............... H01L 27/124; H01L 27/1244; H01L 27/1248
(Continued)

(56) References Cited

U.S. PATENT DOCUMENTS 10,361,395 B2   7/2019  Kajiyama
2003/0117536 A1  6/2003  Jeon
(Continued)

OTHER PUBLICATIONS

Office Action dated Dec. 19, 2019 in Related U.S. Appl. No. 15/964,411.

(Continued)

*Primary Examiner* — Lex H Malsawma
*Assistant Examiner* — Eric W Jones
(74) *Attorney, Agent, or Firm* — F. Chau & Associates, LLC

(57) ABSTRACT

A display device includes a substrate including a display area to display an image and a non-display area provided on at least one side of the display area, a plurality of pixels disposed on the substrate and provided in an area corresponding to the display area, a first insulating layer having an opening in a first area of the non-display area, a second insulating layer provided in the first area, first lines provided on the substrate and connected to the plurality of pixels, and second lines provided on the first and second insulating layers, and connected to the first lines. An area in which the first lines overlap with the second lines is spaced apart from an edge of the second insulating layer when viewed in a plan view.

20 Claims, 19 Drawing Sheets

(51) Int. Cl.
  *G02F 1/1345* (2006.01)
  *H01L 21/768* (2006.01)
  *H01L 51/00* (2006.01)
  *H05B 45/00* (2020.01)
  *G02F 1/1362* (2006.01)
  *H01L 27/32* (2006.01)

(52) U.S. Cl.
  CPC .... *G02F 1/133305* (2013.01); *H01L 27/1218* (2013.01); *H01L 27/1225* (2013.01); *H01L 27/1248* (2013.01); *G02F 1/133345* (2013.01); *G02F 1/136286* (2013.01); *G02F 2201/50* (2013.01); *G09G 2300/0426* (2013.01); *H01L 21/76895* (2013.01); *H01L 27/32* (2013.01); *H01L 27/3258* (2013.01); *H01L 27/3276* (2013.01); *H01L 51/0097* (2013.01); *H01L 2251/5338* (2013.01); *H01L 2251/5392* (2013.01); *H05B 45/60* (2020.01)

(58) Field of Classification Search
  USPC .................................................. 257/40, 59
  See application file for complete search history.

(56) References Cited

U.S. PATENT DOCUMENTS

| | | |
|---|---|---|
| 2007/0114530 A1 | 5/2007 | Kimura |
| 2008/0023837 A1 | 1/2008 | Chen |
| 2008/0204618 A1 | 8/2008 | Jung et al. |
| 2008/0230767 A1 | 9/2008 | Jung et al. |
| 2008/0265253 A1 | 10/2008 | Tian et al. |
| 2010/0149473 A1 | 6/2010 | Guo et al. |
| 2011/0012203 A1 | 1/2011 | Jeong et al. |
| 2013/0043495 A1 | 2/2013 | Ogasawara et al. |
| 2013/0293595 A1 | 11/2013 | Kim et al. |
| 2014/0145153 A1 | 5/2014 | Kim et al. |
| 2014/0239270 A1 | 8/2014 | Ko et al. |
| 2014/0353670 A1* | 12/2014 | Youn .................. H01L 27/3276 257/72 |
| 2014/0374703 A1 | 12/2014 | Jung |
| 2016/0155859 A1 | 6/2016 | Kimura et al. |
| 2016/0179229 A1 | 6/2016 | Ahn |
| 2016/0190166 A1 | 6/2016 | Kim et al. |
| 2017/0185190 A1 | 6/2017 | Jung et al. |
| 2017/0193914 A1 | 7/2017 | Heo et al. |
| 2017/0301280 A1 | 10/2017 | Ka et al. |
| 2017/0309651 A1 | 10/2017 | Kim et al. |
| 2018/0144679 A1 | 5/2018 | Lee et al. |
| 2018/0151650 A1 | 5/2018 | Ha |
| 2018/0226460 A1 | 8/2018 | Zhu et al. |
| 2018/0240856 A1 | 8/2018 | Kim et al. |
| 2018/0358572 A1 | 12/2018 | Harada et al. |
| 2019/0067404 A1 | 2/2019 | Lee |

OTHER PUBLICATIONS

Office Action dated Aug. 12, 2019 in Related U.S. Appl. No. 15/964,411.
Office Action dated Nov. 2, 2017 in corresponding U.S. Appl. No. 15/293,779.
Notice of Allowance dated Sep. 14, 2018 in corresponding U.S. Appl. No. 15/293,779.
Notice of Allowance dated Jun. 2, 2020 in Related U.S. Appl. No. 15/964,411.

* cited by examiner

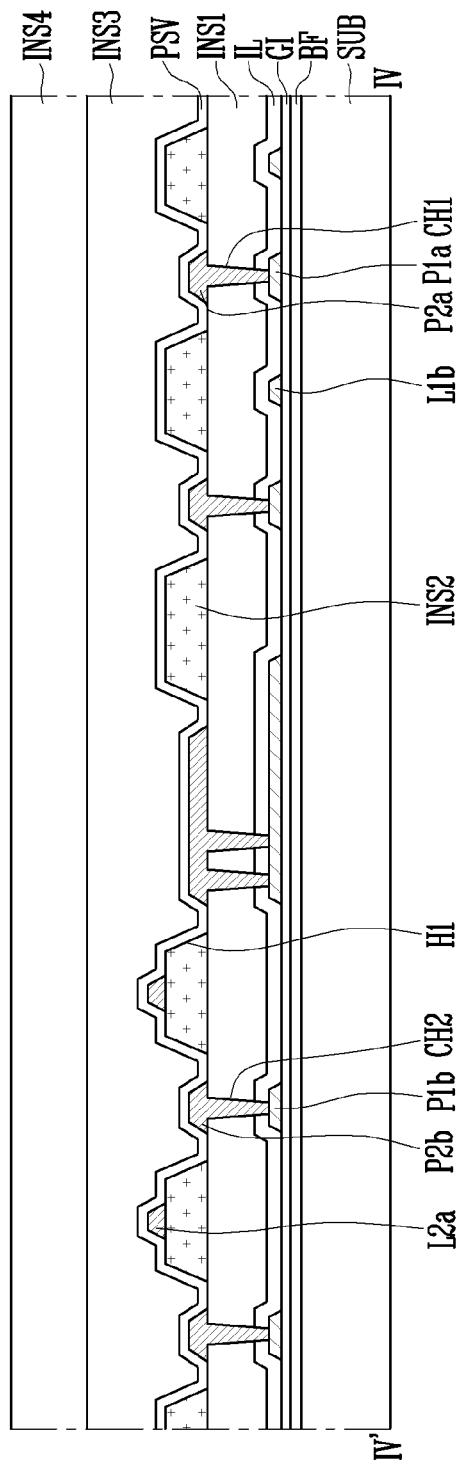

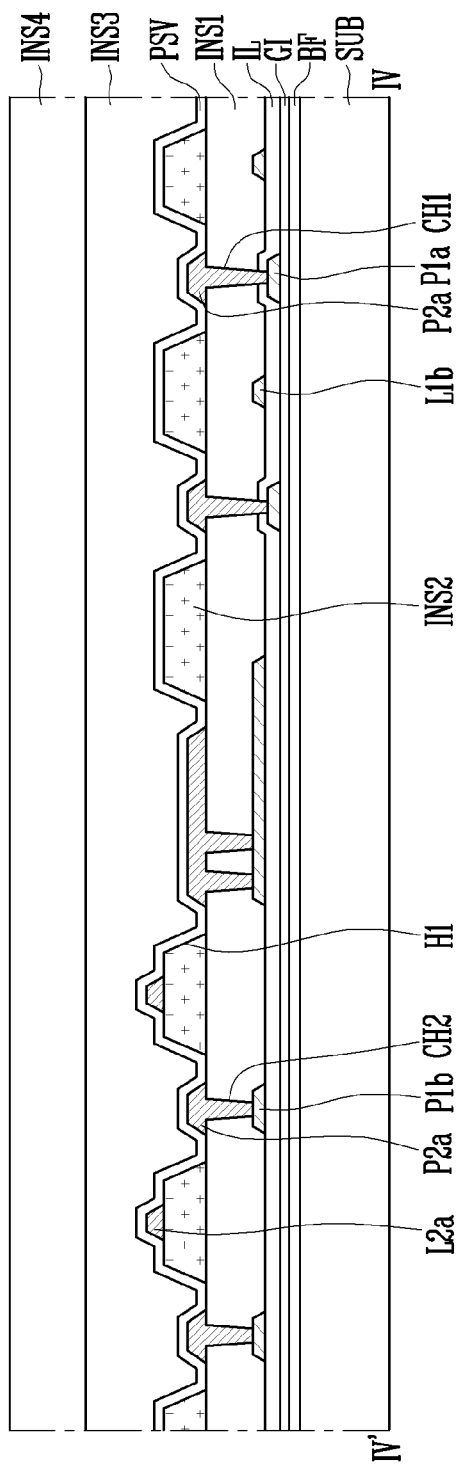

DISPLAY DEVICE WITH OVERLAPPING LINES SPACED APART FROM AN INSULATING LAYER

CROSS REFERENCE TO RELATED APPLICATION(S)

This application is a continuation application of U.S. patent application Ser. No. 15/293,779 filed Oct. 14, 2016, which claims priority under 35 U.S.C. § 119 to Korean Patent Application No. 10-2016-0049637, filed on Apr. 22, 2016 in the Korean Intellectual Property Office, the disclosures of which are incorporated by reference herein in their entireties.

TECHNICAL FIELD

Exemplary embodiments of the inventive concept relate to a display device capable of preventing shorts between lines.

DISCUSSION OF RELATED ART

A display device generally includes a display unit positioned on a substrate. Visibility from various angles may be improved and/or the area of a non-display area may be reduced by bending at least a portion of the display device.

However, for a conventional display device, defects may occur when bending a portion of the display device during the manufacturing process.

SUMMARY

According to an exemplary embodiment of the inventive concept, a display device includes a substrate including a display area to display an image and a non-display area provided on at least one side of the display area, a plurality of pixels disposed on the substrate and provided in an area corresponding to the display area, a first insulating layer having an opening in a first area of the non-display area, a second insulating layer provided in the first area, first lines provided on the substrate and connected to the plurality of pixels; and second lines provided on the first insulating layer and the second insulating layer, and connected to the first lines. An area in which the first lines overlap with the second lines is spaced apart from an edge of the second insulating layer when viewed in a plan view.

The first lines may include first pads provided at an end of each first line and the second lines include second pads provided at an end of each second line. The first pads and the second pads may overlap with each other when viewed in a plan view.

The first insulating layer may include at least one contact hole in an area in which the first pads overlap with the second pads, and the first pads and the second pads may be connected to each other through the at least one contact hole.

The display device may further include an insulating interlayer provided below the first insulating layer and having an opening in the first area. The first lines include first sub-lines provided below the insulating interlayer and second sub-lines provided on the insulating interlayer.

The first sub-lines and the second sub-lines may be alternately arranged when viewed in a plan view.

The second lines may include third sub-lines provided on the first insulating layer and fourth sub-lines provided on a third insulating layer.

The third sub-lines and the fourth sub-lines may be alternately arranged when viewed in a plan view.

The first sub-lines may be connected to the third sub-lines, and the second sub-lines may be connected to the fourth sub-lines.

The second insulating layer may cover the first area and a portion of a second area adjacent to the first area.

The first area may be spaced apart from the display area.

The edge of the second insulating layer may be provided between the display area and the first area.

The second insulating layer may have a hole to expose an upper surface of the first insulating layer in a position corresponding to the first pads and second pads when viewed in a plan view.

The hole may have a greater area than the first pads and the second pads.

Alternatively, the hole may have a smaller area than the first pads and the second pads.

The hole may be provided in a position corresponding to the at least one contact hole of the first insulating layer when viewed in a plan view.

Widths of the first pads and the second pads may be greater than widths of portions of the first and second lines where the first and second pads are not overlapped.

Alternatively, widths of the first pads and the second pads may be substantially the same as widths of portions of the first and second lines where the first and second pads are not overlapped.

A distance between the edge of the second insulating layer and the display area may be greater than a distance between the first and second pads and the display area when viewed in a plan view.

A distance between the edge of the second insulating layer and the display area may be shorter than a distance between the first and second pads and the display area when viewed in a plan view.

The second lines may include third sub-lines provided on the first insulating layer and fourth sub-lines provided on a third insulating layer.

The third sub-lines and the fourth sub-lines may be alternately arranged when viewed in a plan view.

The display device may further include a third insulating layer provided on the first insulating layer and the second insulating layer.

The third insulating layer may include a second opening along an edge of the display area.

Each pixel may include an active pattern provided on the substrate, a gate insulating layer provided on the active pattern, a gate electrode provided between the gate insulating layer and the first insulating layer, a source electrode and a drain electrode provided on the first insulating layer, a first electrode provided on the third insulating layer and connected to the drain electrode, an organic layer provided on the first electrode, and a second electrode provided on the organic layer.

At least a portion of the first lines may be provided on the same layer and with substantially the same material as the gate electrode.

At least a portion of the second lines may be provided on the same layer and with substantially the same material as the source electrode and the drain electrode.

The first insulating layer may include an inorganic material.

The second insulating layer may include an organic material.

The first area may extend in a first direction, and the substrate may be bent along a folding line extending in the first direction.

An area of the display device other than the first area may be flat.

According to an exemplary embodiment of the inventive concept, a display device includes a substrate including a display area to display an image and a non-display area provided on at least one side of the display area, a plurality of pixels disposed on the substrate and provided in an area corresponding to the display area, a first insulating layer having an opening in a bendable area of the non-display area, a second insulating layer provided in the opening of the bendable area, first lines provided on the substrate and connected to the plurality of pixels, and second lines connected to the first lines. The first lines overlap with the second lines in a plurality of overlapping portions. The plurality of overlapping portions is not overlapped with the second insulating layer. The plurality of overlapping portions includes first to N-th overlapping portions. Odd-numbered and even-numbered overlapping portions, among the first to N-th overlapping portions, have a first distance and a second distance, respectively, from the display area. The first distance is either greater than or less than the second distance.

The second lines may include first sub-lines and second sub-lines. The first sub-lines and the second sub-lines are provided on different layers.

A distance between an edge of the second insulating layer and the display area may be greater than a distance between the plurality of overlapping portions and the display area.

The plurality of overlapping portions may include first pads and second pads. The first pads are provided at an end of each first line. The second pads are provided at an end of each second line. The first pads include first sub-pads and second sub-pads. The second pads include third sub-pads and fourth sub-pads. The first sub-pads and the second sub-pads overlap with the third sub-pads and the fourth sub-pads, respectively.

The display device may further include a bridge pattern provided in an area in which the second sub-pads are formed. The second sub-pads are connected to the fourth sub-pads through the bridge pattern.

BRIEF DESCRIPTION OF THE DRAWINGS

FIG. 5C is a cross sectional view taken along line IV-IV' of FIG. 4 according to exemplary embodiments of the inventive concept.

FIG. 7C is a cross sectional view taken along line IV-IV' of FIG. 6 according to exemplary embodiments of the inventive concept.

DETAILED DESCRIPTION OF THE EMBODIMENTS

Figure 1:
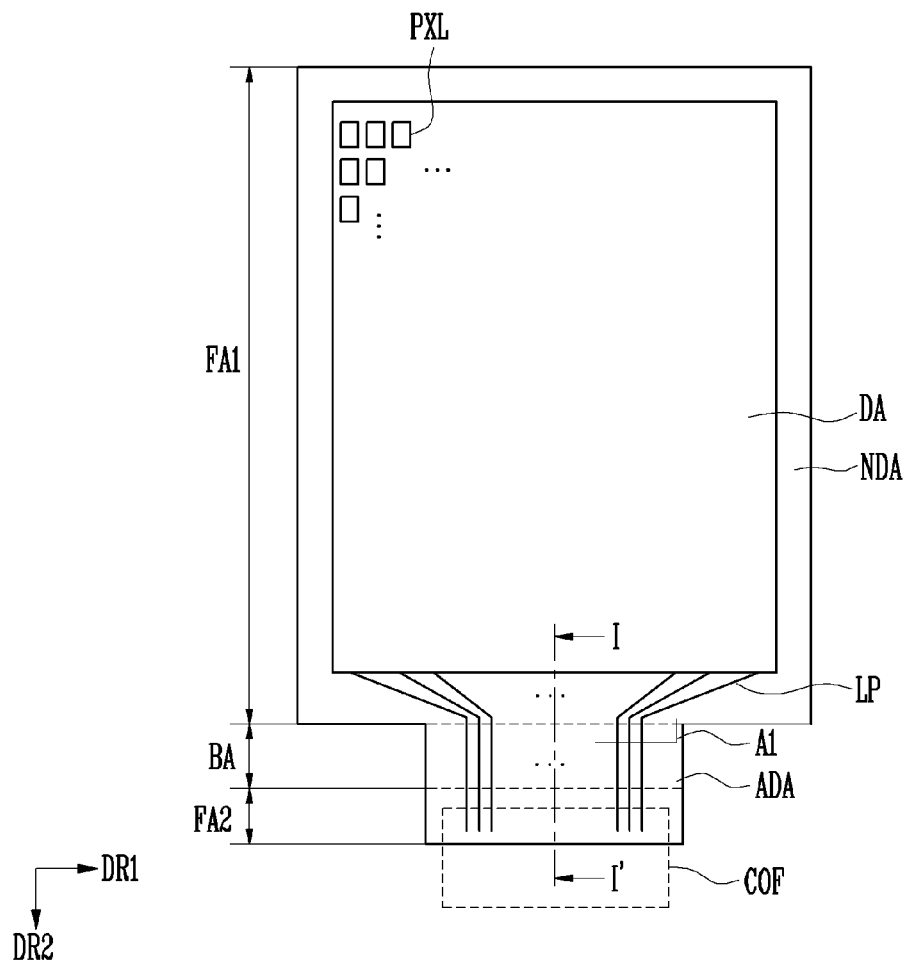
FIG. 1 is a plan view of a display device according to an exemplary embodiment of the inventive concept.

Exemplary embodiments of the inventive concept will be described more fully hereinafter with reference to the accompanying drawings. Like reference numerals may refer to like elements throughout the accompanying drawings.

In the drawings, sizes of structures may be exaggerated for clarity. The terms 'first' and 'second' are used to describe various elements, but the elements are not limited to these terms. The terms are used to distinguish one element from another element. For example, the first element may be referred as the second element and similarly, the second element may be referred to as the first element, without departing from the spirit and scope of the inventive concept. Expressions used in the singular may include expressions in the plural unless it is explicitly different in the context.

It will be understood that when an element or layer is referred to as being "on," "connected to," or "coupled to" another element or layer, it can be directly on, connected, or coupled to the other element or layer, or intervening elements or layers may be present. As used herein, the term "and/or" includes any and all combinations of one or more of the associated listed items.

Exemplary embodiments of the inventive concept may minimize defects, such as disconnections or shorts, that occur during the manufacturing process for a display device, and may ensure a long life for the display device.

Figure 2:
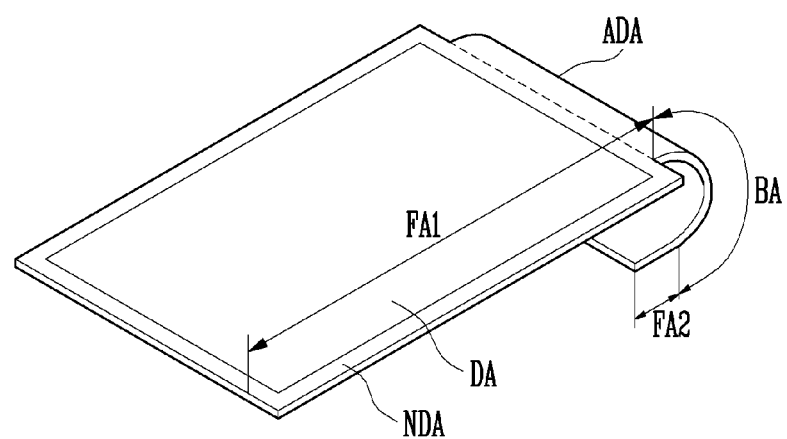
FIG. 2 is a perspective view of a display device of FIG. 1 according to an exemplary embodiment of the inventive concept.

FIG. 1 is a plan view of a display device according to an exemplary embodiment of the inventive concept and FIG. 2 is a perspective view of a display device of FIG. 1.

Figure 3:
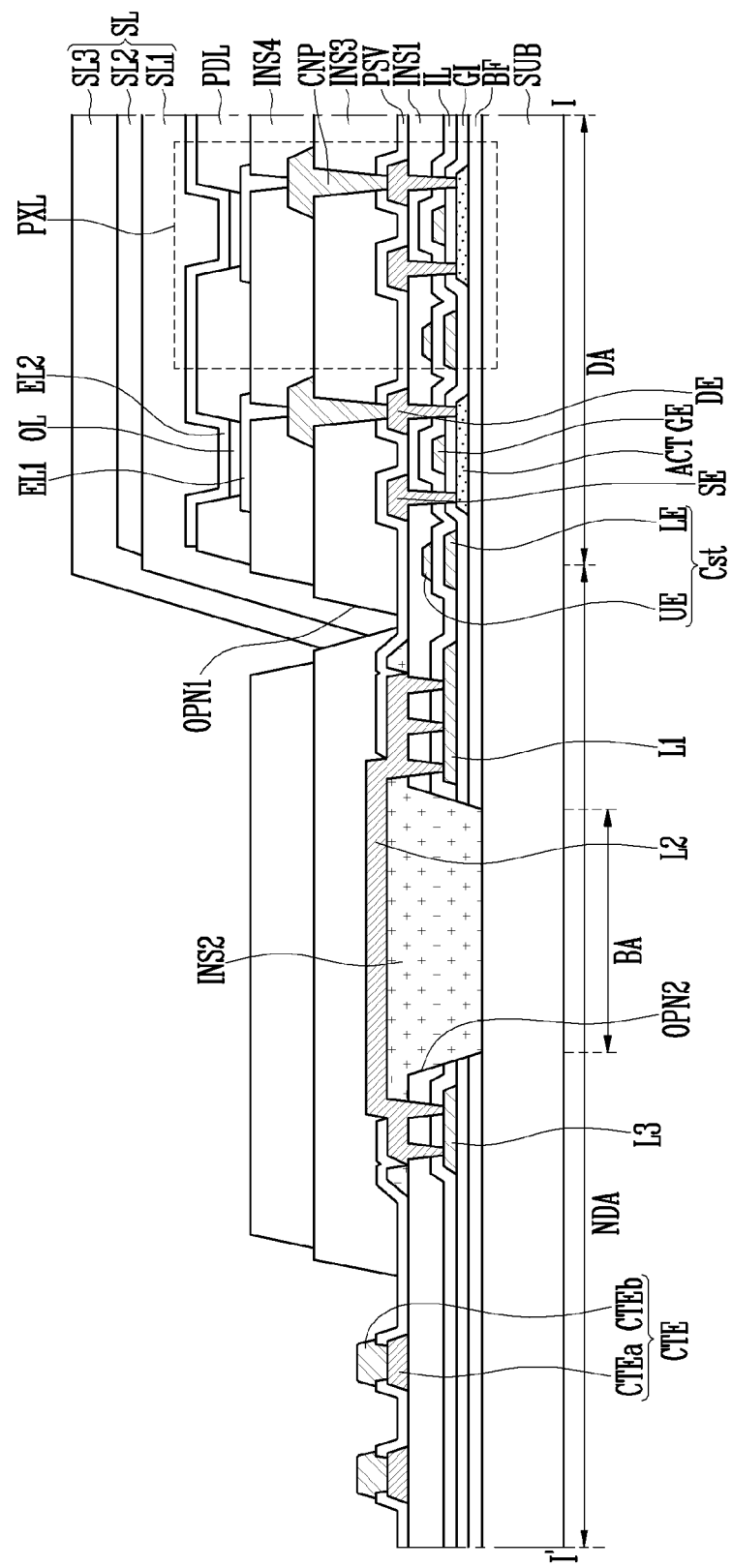
FIG. 3 is a cross sectional view taken along line I-I' of FIG. 1 according to an exemplary embodiment of the inventive concept.

Referring to FIGS. 1 and 2, a display device may include a substrate SUB (as shown in FIG. 3), a plurality of pixels PXL provided on the substrate SUB, and a line part LP connected to the pixels PXL.

The substrate SUB may include a display area DA and a non-display area NDA provided on at least one side of the display area DA.

The substrate SUB may roughly have a rectangular shape. According to an exemplary embodiment of the inventive concept, the substrate SUB may include a pair of short sides parallel with each other in a first direction DR1 and a pair of long sides parallel with each other in a second direction DR2.

However, the shape of the substrate SUB may be not limited thereto, and may have various shapes. For example, the substrate SUB may be provided in a variety of shapes, such as a polygon in a closed form with sides formed by straight lines, a circle with sides formed by a curve, an ellipse, a semicircle including sides formed by a straight line and a curve, a semi elliptical shape, etc. According to an exemplary embodiment of the inventive concept, when the substrate SUB has sides formed by a straight line, the corners of the substrate SUB may be curved. In other words, when the substrate SUB has a rectangular shape, portions where adjacent sides meet may be formed by a curve with a predetermined curvature. The curvature may be determined differently depending on the location. For example, the curvature may vary depending on where the curve starts and the length of the curve.

The display area DA may be provided in a shape corresponding to the shape of the substrate SUB, as described above. For example, according to an exemplary embodiment of the inventive concept, when the display area DA has sides formed by straight lines, the corners may be formed by a curve.

The pixels PXL may be provided on or in the display area DA of the substrate SUB to display an image. The plurality of pixels PXL may be provided as a minimum unit for displaying the image. The pixels PXL may emit light in red, green, or blue, but are not limited thereto. For example, the pixels PXL may emit light in cyan, magenta, or yellow.

The pixels PXL may be an organic light emitting device including an organic layer, but are not limited thereto. For example, the pixels PXL may beimplemented in various forms, such as a liquid crystal device, an electrophoretic device, or an electrowetting device.

According to an exemplary embodiment of the inventive concept, the plurality of pixels PXL may be arranged in a matrix formation with rows extending in the first direction DR1 and columns extending in the second direction DR2. However, the arrangement of the pixels PXL is not limited thereto, and the pixels PXL may be arranged in a variety of ways. For example, the pixels PXL may be arranged in a row direction or in an oblique direction with respect to the first direction DR1 or the second direction DR2.

The non-display area NDA may be an area in which the pixels PXL are not provided and thus, the image is not displayed.

The non-display area NDA may include the line part LP connected to the pixels PXL and a driver connected to the pixels PXL that drives the pixels PXL.

The line part LP may be connected to the pixels PXL. The line part LP may provide a signal to each of the pixels PXL. The line part LP may include a scan line, a data line, and a driving voltage line, and may further includes other lines as needed.

The line part LP may be provided over the display area DA and the non-display area NDA.

The line part LP may be connected to the driver. The driver may provide a signal to each of the pixels PXL through the line part LP and control the driving of each of the pixels PXL.

The driver may include a scan driver that provides a scan signal to each of the pixels PXL through the scan line, a data driver that provides a data signal to each of the pixels PXL through the data line, and a timing controller that controls the scan driver and the data driver.

According to an exemplary embodiment of the inventive concept, the scan driver may be directly mounted on the substrate SUB. When the scan driver is directly mounted on the substrate SUB, the scan driver may be formed when the pixels PXL are formed. However, the inventive concept is not limited thereto. For example, the scan driver may be formed on a separate chip and provided as a chip-on-glass type on the substrate SUB, or may be mounted on a printing circuit board and connected to the substrate SUB through a connecting member.

According to an exemplary embodiment of the inventive concept, the data driver may be directly mounted on the substrate SUB, but is not limited thereto. According to an exemplary embodiment of the inventive concept, the data driver may be formed on a separate chip and provided as a chip-on-glass type on the substrate SUB, or mounted on a printing circuit board and connected to the substrate SUB through a connecting member. According to an exemplary embodiment of the inventive concept, the data driver may be formed in a chip on layer or chip-on-film COF shape and connected to the substrate SUB.

According to an exemplary embodiment of the inventive concept, the non-display area NDA may further include an additional area ADA protruding from a portion thereof. The additional area ADA may protrude from the sides of the substrate SUB constituting the non-display area NDA. According to an exemplary embodiment of the inventive concept, the additional area ADA may protrude from one of the short sides of the substrate SUB, as illustrated in FIG. 1. However, alternatively, the additional area ADA may protrude from one of the long sides or from two or more sides. According to an exemplary embodiment of the inventive concept, the data driver may be provided with or connected to the additional area ADA, but the data driver is not limited thereto and may be provided in various constituent elements.

According to an exemplary embodiment of the inventive concept, at least a portion of the display device may have flexibility and the display device may be folded or bent at the flexible portion. In other words, the display device may include a bendable area BA (or foldable area) that has flexibility and can be bent in one direction, and a flat area provided on at least one side of the bendable area BA that is relatively flat (e.g., not bent). The flat area may or may not have flexibility.

According to an exemplary embodiment of the inventive concept, the bendable area BA may be provided on the additional area ADA. According to an exemplary embodiment of the inventive concept, the flat area includes a first flat area FA1 and a second flat area FA2, spaced apart from each other with the bendable area BA disposed therebetween. According to an exemplary embodiment of the inventive concept, the bendable area BA may be spaced apart from the display area DA.

A line where the display device is folded may be defined as a folding line. The folding line may be provided in the bendable area BA. The term "bendable" indicates that the structure is not fixed and to "fold" is to change the structure from an original type to a different type. In other words, one or more specific lines may be folded, curved, or rolled along the folding line. According to an exemplary embodiment of the inventive concept, the sides of the flat area FA1 and the flat area FA2 nearest to the bendable area BA may be arranged in parallel and opposite to each other, as illustrated in FIG. 1. However, the inventive concept is not limited thereto. For example, these sides of the flat area FA1 and the flat area FA2 may be folded at a predetermined angle (e.g., an acute angle, a right angle, or an obtuse angle) with the bendable area BA disposed therebetween.

According to an exemplary embodiment of the inventive concept, the additional area ADA may be bent along the folding line, such that a width of a bezel may be reduced.

FIG. 3 is a cross sectional view taken along line I-I' of FIG. 1 according to an exemplary embodiment of the inventive concept. The display device may have a partially bent shape as shown in FIG. 2. However, in FIG. 3, for convenience of explanation, a display device that is not bent is illustrated. In other words, the display device is configured to be bent and is illustrated in its form prior to bending. For convenience of explanation, a display device prior to bending is illustrated in the cross sectional or plan views of the exemplary embodiments described below as well.

According to an exemplary embodiment of the inventive concept, the display area DA is provided with the plurality of pixels PXL. Each of the pixels PXL may include a transistor connected to a corresponding line in the line part LP, an organic light emitting device connected to the transistor, and a capacitor Cst. The transistor may include a driving transistor for controlling the organic light emitting device and a switching transistor for switching the driving transistor.

The pixels PXL may be implemented with a stacked layer structure as shown in FIG. 3. In FIG. 3, a single pixel PXL is illustrated with a single transistor and a single capacitor for convenience of explanation, but the inventive concept is not limited thereto. For example, two or more transistors and one or more capacitors may be included in the single pixel PXL, or three or more transistors and two or more capacitors may be included in the single pixel PXL.

According to an exemplary embodiment of the inventive concept, the pixels PXL may be provided on the substrate SUB.

The substrate SUB may be made of an insulating material such as glass or resin. In addition, the substrate SUB may be made of a material having the flexibility to be bent or folded, and may have a single layer structure or a multilayer structure.

For example, the substrate SUB may include one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, or cellulose acetate propionate. However, the material constituting the substrate SUB may be varied and may include fiber reinforced plastic (FRP) or the like.

A buffer layer BF is formed on the substrate SUB. The buffer layer BF prevents diffusion of impurities to the switching transistors and the driving transistors. The buffer layer BF may be an inorganic insulating layer made of an inorganic material. For example, the buffer layer BF may be formed of silicon nitride, silicon oxide, silicon oxynitride, etc. The buffer layer BF may be omitted depending on the material and process conditions of the substrate SUB.

An active pattern ACT is provided on the buffer layer BF. The active pattern ACT may be formed of a semiconductor material. The active pattern ACT may include a source area, a drain area, and a channel area provided between the source area and the drain area. The active pattern ACT may be a semiconductor pattern formed of polysilicon, amorphous silicon, and an oxide semiconductor. The channel area may be an intrinsic semiconductor having a semiconductor pattern that is not doped with the impurities. The source area and the drain area may have a semiconductor pattern that is doped with the impurities. The impurities may be n-type impurity, p-type impurity, or other metals.

A gate insulating layer GI is provided on the active pattern ACT. The gate insulating layer GI may be an inorganic insulating layer made of an inorganic material. The inorganic material may be used as an inorganic insulating material, such as polysiloxane, silicon nitride, silicon oxide, or silicon oxynitride.

A gate electrode GE and a capacitor lower electrode LE are provided on the gate insulating layer GI. The gate electrode GE may be formed to cover an area corresponding to the channel area of the active pattern ACT.

The gate electrode GE and the capacitor lower electrode LE may be made of metal. For example, the gate electrode GE may be made of at least one of gold (Au), silver (Ag), aluminum (Al), molybdenum (Mo), chromium (Cr), titanium (Ti), nickel (Ni), neodymium (Nd), copper (Cu), or an alloy of metals. In addition, the gate electrode GE may be formed as a single layer, but is not limited thereto and may be formed with a multilayer structure in which the above-described metals and/or an alloy of two or more metals are formed.

According to an exemplary embodiment of the inventive concept, other lines including scan lines may be provided on the same layer as the gate electrode GE and the capacitor lower electrode LE with substantially the same material. These other lines may be directly or indirectly connected to a portion (e.g., the gate electrode GE) of the transistor in each of the pixels PXL.

An insulating interlayer IL is provided on the gate electrode GE and the capacitor lower electrode LE. The insulating interlayer IL may be an inorganic insulating layer made of an inorganic material. The inorganic material may include polysiloxane, silicon nitride, silicon oxide, silicon oxynitride, or the like.

A capacitor upper electrode UE is provided on the insulating interlayer IL. The capacitor upper electrode UE may be made of metal. For example, the capacitor upper electrode UE may be formed of at least one gold (Au), silver (Ag), aluminum (Al), molybdenum (Mo), chromium (Cr), titanium (Ti), nickel (Ni), neodymium (Nd), copper (Cu), or an alloy of metals. In addition, the capacitor upper electrode UE may be formed with a single layer or multilayer structure, similar to the gate electrode GE as described above.

The capacitor lower electrode LE and the capacitor upper electrode UE constitute a capacitor with the insulating interlayer IL interposed therebetween. According to the present exemplary embodiment, the capacitor Cst includes the capacitor lower electrode LE and the capacitor upper electrode UE, but the capacitor Cst is not limited thereto and may be implemented in a variety of ways.

A first insulating layer INS1 is provided on the capacitor upper electrode UE. The first insulating layer INS1 may be an inorganic insulating layer made of an inorganic material. The inorganic material may include polysiloxane, silicon nitride, silicon oxide, silicon oxynitride, or the like.

A source electrode SE and a drain electrode DE are provided on the first insulating layer INS1. The source electrode SE and the drain electrode DE may contact the source area and the drain area, respectively, through a contact hole formed on the first insulating layer INS1, the insulating interlayer IL, and the gate insulating layer GI.

The source electrode SE and the drain electrode DE may be made of metal. For example, the source electrode SE and the drain electrode DE may be formed of gold (Au), silver (Ag), aluminum (Al), molybdenum (Mo), chromium (Cr), titanium (Ti), nickel (Ni), neodymium (Nd), copper (Cu), or an alloy of metals. In addition, the source electrode SE and the drain electrode DE may be formed with a single layer or multilayer structure, similar to the gate electrode GE as described above.

According to an exemplary embodiment of the inventive concept, data lines or power lines may be provided on the same layer as the source electrode SE and the drain electrode DE using substantially the same material. The data lines or the power lines may be directly or indirectly connected to a portion of the transistors in each of the pixels PXL, for example, the source electrode SE and/or the drain electrode DE.

A passivation layer PSV is provided on the source electrode SE and the drain electrode DE. The passivation layer PSV may be an inorganic insulating layer made of an inorganic material. The inorganic material may include polysiloxane, silicon nitride, silicon oxide, silicon oxynitride, or the like.

A third insulating layer INS3 is provided on the passivation layer PSV. The third insulating layer INS3 may be an organic insulating layer made of an organic material. The organic material may include an organic insulating material, such as a polyacrylic compound, a polyimide-based compound, a fluorine-containing carbon compound such as Teflon, or a benzocyclobutene compound.

A connecting pattern CNP is provided on the third insulating layer INS3. The connecting pattern CNP may be connected to the drain electrode DE of the transistor via a contact hole passing through the third insulating layer INS3 and the passivation layer PSV. The connecting pattern CNP may be formed of at least one metal, for example, gold (Au), silver (Ag), aluminum (Al), molybdenum (Mo), chromium (Cr), titanium (Ti), nickel (Ni), neodymium (Nd), copper (Cu), or an alloy of metals. In addition, the connecting pattern CNP may be formed with a single layer or multilayer structure, similar to the gate electrode GE described above.

According to an exemplary embodiment of the inventive concept, other lines such as a dummy power line may be provided on the same layer as the connecting pattern CNP with substantially the same material.

A fourth insulating layer INS4 is provided on the connecting pattern CNP. The fourth insulating layer INS4 may be an organic insulating layer made of an organic material. The organic material may include an organic insulating material, such as a polyacrylic compound, a polyimide-based compound, a fluorine-containing carbon compound such as Teflon, or a benzocyclobutene compound.

A first electrode EL1 is provided on the fourth insulating layer INS4. The first electrode EL1 is connected to the connecting pattern CNP through a contact hole penetrating the fourth insulating layer INS4, and is connected to the drain electrode DE through the contact hole penetrating the third insulating layer INS3 and the passivation layer PSV. The first electrode EL1 may be used as one of an anode or a cathode.

According to an exemplary embodiment of the inventive concept, the passivation layer PSV, the third insulating layer INS3, and the fourth insulating layer INS4 may be provided on the drain electrode DE, but the arrangement of the layers may be changed. For example, according to an exemplary embodiment of the inventive concept, only the passivation layer PSV may be provided on the drain electrode DE, and the first electrode EL1 may be provided on the passivation layer PSV. According to an exemplary embodiment of the inventive concept, only the passivation layer PSV and the third insulating layer INS3 may be provided, and the first electrode EL1 may be provided on the third insulating layer INS3. In this case, the connecting pattern CNP may be omitted and the first electrode EL1 may be directly connected to the drain electrode DE.

The first electrode EL1 may be formed of a metal layer using an alloy of Ag, Mg, Al, Pt, Pd, Au, Ni, Nd, Ir, or Cr and/or indium tin oxide (ITO), indium zinc oxide (IZO), zinc oxide (ZnO), or indium tin zinc oxide (ITZO).

According to an exemplary embodiment of the inventive concept, the first electrode EL1 is made of a single type of metal, but the first electrode EL1 is not limited thereto and may be made of two or more metals, e.g., an alloy of Ag and Mg.

The first electrode EL1 may be formed of a transparent conductive layer when providing the image in a lower direction of the substrate SUB. The first electrode EL1 may be formed of a metal reflective layer and/or a transparent conductive layer when providing the image in an upper direction of the substrate SUB.

A pixel defining layer PDL for partitioning an area so as to correspond to each of the pixels PXL is provided on the substrate SUB. The pixel defining layer PDL may be an organic insulating layer made of an organic material. The organic material may include an organic insulating material, such as a polyacrylic compound, a polyimide-based compound, a fluorine-containing carbon compound such as Teflon, or a benzocyclobutene compound.

The pixel defining layer PDL exposes an upper surface of the first electrode EL1, and protrudes from the substrate SUB along a periphery of the pixel PXL.

An organic layer OL is provided in an area surrounded by the pixel defining layer PDL.

The organic layer OL may include a material with a low molecular weight or a polymer. The material with a low molecular weight includes copper phthalocyanine (CuPc), N,N-di(naphthalene-1-yl)-N,N'-diphenylbenzidine (NPB), or tris-8-hydroxyquinoline aluminum (Alq3). These materials may be formed by a vacuum deposition method. The polymer material may include PEDOT, poly phenylenevinylene (PPV), polyfluorene, or the like.

The organic layer OL may be provided as a single layer or may be provided with multiple layers that include a variety of functional layers. When the organic layer OL is provided with a multi-layer structure, a hole injection layer HIL, a hole transport layer HTL, an emitting layer EML, an electron transport layer ETL, an electron injection layer EIL, and the like may have a single structure or a composite structure. The organic layer OL may be formed by a screen printing method, an inkjet printing method, a laser induced thermal imaging (LITI) method, etc.

The organic layer OL may not be necessarily limited thereto, and may have a variety of structures. At least a portion of the organic layer OL may be integrally formed over the first electrode ELL or may be separately provided to correspond to the first electrode ELL A second electrode EL2 is formed on the organic layer OL. The second electrode EL2 may be provided for each of the pixels PXL. The plurality of second electrodes EL2 may be provided to cover most of the display area DA and shared by the plurality of pixels PXL.

The second electrode EL2 may be used as one of an anode or a cathode. When the first electrode EL1 is an anode, the second electrode EL2 may be used as a cathode, and when the first electrode EL1 is a cathode, the second electrode EL2 may be used as an anode.

The second electrode EL2 may be formed of a metal layer including Ag, Mg, Al, Pt, Pd, Au, Ni, Nd, Ir, Cr, etc. or a transparent conductive layer including, e.g., indium tin oxide (ITO), indium zinc oxide (IZO), zinc oxide (ZnO), or indium tin zinc oxide (ITZO). According to an exemplary embodiment of the inventive concept, the second electrode EL2 may be formed with a double layer structure or a multiple layer structure containing a metal thin film. For example, the second electrode EL2 may be formed of a triple layer of ITO/Ag/ITO.

When providing the image in the lower direction of the substrate SUB, the second electrode EL2 may be formed of a metal reflective layer and/or a transparent conductive layer. When providing the image in the upper direction of the substrate SUB, the second electrode EL2 may be formed of a transparent conductive layer.

A sealing layer SL is provided on the second electrode EL2. The sealing layer SL may be made of a single layer or multiple layers. According to an exemplary embodiment of the inventive concept, the sealing layer SL may be formed of a first sealing layer SL1, a second sealing layer SL2, and a third sealing layer SL3. The first sealing layer SL1 to the third sealing layer SL3 may be made of an organic material and/or an inorganic material. The third sealing layer SL3 arranged as the outermost sealing layer may be made of an inorganic material. According to an exemplary embodiment of the inventive concept, the first sealing layer SL1 may be made of an inorganic material, the second sealing layer SL2 may be made of an organic material, and the third sealing layer SL3 may be made of an inorganic material. For inorganic layers, infiltration of moisture or oxygen may be better prevented, but they are more susceptible to cracks due to less elasticity or flexibility. Spreading of cracks may be prevented by forming the first sealing layer SL1 and the third sealing layer SL3 with inorganic material, and forming the second sealing layer SL2 with organic material. The second sealing layer SL2 formed with organic material may be completely covered by the third sealing layer SL3 so that the end portions of the second sealing layer SL2 are not externally exposed. An organic insulating material may be used for the organic material, such as a polyacrylic compound, a polyimide-based compound, a fluorine-containing carbon compound such as Teflon, and a benzocyclobutene compound. Polysiloxane, silicon nitride, silicon oxide, or silicon oxynitride may be used for the inorganic material.

According to an exemplary embodiment of the inventive concept, the organic layer OL, which forms a light emitting device, may be easily damaged by moisture or oxygen from external sources. As such, the sealing layer SL covers the organic layer OL for protection. The sealing layer SL covers the display area DA and may extend to the outside of the display area DA. However, if an insulating layer is made of organic material, although it may be more flexible and elastic, infiltration of moisture or oxygen may be relatively easier compared to an insulating layer made of inorganic material. According to an exemplary embodiment of the inventive concept, to prevent infiltration of moisture or oxygen through the insulating layer made of organic material, the end portions of the insulating layer are covered by insulating layers made of the inorganic material so as not to be externally exposed. For example, the third insulating layer INS3, the fourth insulating layer INS4, and/or the pixel defining layer PDL made of organic material may not continuously extend to the non-display area NDA, and may include a first opening OPN1 in which a portion thereof is removed along the periphery of the first opening OPN1. Accordingly, an upper surface of the pixel defining layer PDL, the third insulating layer INS3 exposed by the first opening OPN1, the fourth insulating layer INS4, and/or the side of the pixel defining layer PDL may be sealed by the insulating layer including the inorganic material, e.g., the sealing layer SL, so that the side of the pixel defining layer PDL may be prevented from being externally exposed However, the layer structure and material of the sealing layer SL are not limited to thereto, but may be variously changed. For example, the sealing layer SL may include a number of organic material layers and inorganic material layers alternately stacked on each other.

The non-display area NDA will be described below and descriptions already made above will be omitted or briefly described to avoid repeat explanations.

According to an exemplary embodiment of the inventive concept, the line part LP is provided in the non-display area NDA, and the bendable area BA in which the substrate SUB is folded may be included therein.

The line part LP includes the scan lines, the data lines, and the power lines. According to an exemplary embodiment of the inventive concept, the lines constituting the line part LP may be the data lines. However, the lines constituting the line part LP may be differently formed.

The line part LP includes a plurality of lines. Each line may connect the pixels PXL to the driver and approximately extend from the pixels PXL in the second direction DR2 to provide the connection. The lines may extend to an end portion of the additional area ADA in the second direction DR2, and the end portion may be provided in a contact electrode CTE. The pixels PXL may be connected to the driver, implemented as a chip on layer or the like, through the contact electrode CTE coupled to the lines.

The line part LP includes first lines L1, second lines L2, and third lines L3. The first lines L1 and the second lines L2 may be connected one to one. The second lines L2 and the third lines L3 may be connected one to one.

The line part LP may be implemented in a stacked structure in the non-display area NDA, as illustrated in FIG. 3. In FIG. 3, for convenience of explanation, since only portions of the first lines L1 and the second lines L2 are schematically illustrated, the relation between the first lines L1 and the second lines L2 will be described below.

The buffer layer BF is provided on the non-display area NDA of the substrate SUB. The buffer layer BF may have a second opening OPN2 in the bendable area BA.

The gate insulating layer GI is provided on the buffer layer BF.

The first lines L1 and the third lines L3 may be provided on the gate insulating layer GI. The first line L1 may be provided in the first flat area FA1 and the third lines L3 may be provided in the second flat area FA2. The first lines L1 and the third lines L3 may be formed in the same process with substantially the same material as the gate electrode GE.

The insulating interlayer IL is provided on the first lines 1 and the third lines L3.

The first insulating layer INS1 may be provided on the insulating interlayer IL.

The second opening OPN2 is provided in the insulating layer in the bendable area BA. As described above, the bendable area BA may be a portion of the substrate SUB that may be bent. The second opening OPN2 may be provided by removing areas, corresponding to the bendable area BA, in the buffer layer BF, the gate insulating layer GI, the insulating interlayer IL, and the first insulating layer INS1.

As the second opening OPN2 corresponds to the bendable area BA, the second opening OPN2 overlaps with the bendable area BA. The area of the second opening OPN2 may be greater than the area of the bendable area BA. For convenience of explanation, it is illustrated in FIG. 3 that a width of the second opening OPN2 and a width of the bendable area BA are substantially the same. However, the width of the second opening OPN2 may be greater than the width of the bendable area BA.

The inner sides of the buffer layer BF, the gate insulating layer GI, the insulating interlayer IL, and the first insulating layer INS1 in the second opening OPN2 may be disposed in a straight line such that the openings of these layers are substantially the same, but the inventive concept is not limited thereto. For example, an opening of the first insulating layer INS1 may be greater than an opening of the buffer layer BF. According to an exemplary embodiment of the inventive concept, the area of the second opening OPN2 may be defined as a smallest area among those of the buffer layer BF, the gate insulating layer GI, the insulating interlayer IL, and the first insulating layer INS1.

A second insulating layer INS2 is provided in the second opening OPN2. The second insulating layer INS2 may fill at least a portion of the second opening OPN2. In FIG. 3, it is illustrated that the second insulating layer INS2 fills all of the second opening OPN2. According to an exemplary embodiment of the inventive concept, the second insulating layer INS2 may fill the second opening OPN2 and a portion adjacent to the second opening OPN2, e.g., an upper portion of the first insulating layer INS1 corresponding to the flat areas FA1 and FA2.

The second insulating layer INS2 may be an organic insulating layer made of an organic material. The organic material may include an organic insulating material, such as a polyacrylic compound, a polyimide-based compound, a fluorine-containing carbon compound such as Teflon, and a benzocyclobutene compound.

The second lines L2 are provided on the first insulating layer INS1 and the second insulating layer INS2. In addition, a lower contact electrode CTEa may be provided on the first insulating layer INS1. The second lines L2 and the lower contact electrode CTEa may be formed in the same process as the source electrode SE and the drain electrode DE with substantially the same material. The second lines L2 may extend from the first flat area FA1 to the second flat area FA2 over the bendable area BA and may be disposed on the second insulating layer INS2. The second lines L2 may be disposed on the first insulating layer INS1 in a portion in which the second insulating layer INS2 is not provided.

As described above, in FIG. 3, the display device is illustrated prior to being bent. However, the display device may be bent in the bendable area BA. The display device may be formed to be flat, and is eventually bent. When the display device is bent after manufacturing, tensile stress may be applied to the second lines L2 during the process of the bending of the substrate SUB, etc. However, as described above, the second lines L2 may be provided on the second insulating layer INS2 formed of organic material having elasticity and flexibility, thus minimizing defects on the second lines L2. In other words, according to an exemplary embodiment of the inventive concept, the inorganic insulating layer made having low elasticity and flexibility may be removed in the bendable area BA to maintain the flexibility and elasticity of the substrate SUB. In addition, defects may be reduced, which occur when the insulating layers made of inorganic materials, which have low elasticity and flexibility, are bent.

When the inorganic insulating layers, such as the buffer layer BF, the gate insulating layer GI, the insulating interlayer IL, and/or the first insulating layer INS1, are provided in the bendable area BA, great tensile stress may be applied to the lines provided on these inorganic insulating layers (e.g., the second lines L2) during the process of the bending the substrate SUB. In other words, the inorganic insulating layers are likely to have cracks because of the relatively high hardness and low flexibility compared with the organic insulating layer. When a crack occurs in the inorganic insulating layer, the cracks may be propagated to the lines on the inorganic insulating layer (e.g., the second lines L2), and eventually may result in defects such as disconnection of the line.

According to an exemplary embodiment of the inventive concept, the bendable area BA is illustrated in FIG. 3 to coincide with a portion in which the inorganic insulating layer is removed, which is for the convenience of explanation. The bendable area BA and the removed portion of the inorganic insulating layer may not exactly overlap. For example, the bendable area BA may generally correspond to the portion in which the inorganic insulating layer has been removed, or may be greater or smaller than the portion in which the inorganic insulating layer has been removed, as needed. In addition, according to an exemplary embodiment of the inventive concept, only the bendable area BA is disposed in the non-display area NDA, but the inventive concept is not limited thereto. For example, the bendable area BA may be provided over the non-display area NDA and the display area DA, or may be provided in the display area DA.

The passivation layer PSV may be provided on the substrate SUB. The passivation layer PSV may not be provided in the area corresponding to the bendable area BA. Further, the passivation layer PSV may expose a portion of an upper surface of the lower contact electrode CTEa.

The third insulating layer INS3 may be provided on the passivation layer PSV. The fourth insulating layer INS4 may be provided on the third insulating layer INS3. The first opening OPN1 along the periphery of the display area DA may be provided in the third insulating layer INS3 and the fourth insulating layer INS4. Accordingly, the third insulating layer INS3 and the fourth insulating layer INS4 may not continuously extend to the non-display area NDA from the display area DA, but may be disconnected at the edge of the display area DA. As described above, side surfaces of the third insulating layer INS3 and the fourth insulating layer INS4 provided on the side of the display area DA may be covered by the sealing layer SL, but in the non-display area NDA, the upper surface of the fourth insulating layer INS4 and side surfaces of the fourth insulating layer INS4 and the third insulating layer INS3 may be externally exposed.

After formation of the third insulating layer INS3, an upper contact electrode CTEb may be formed. The upper contact electrode CTEb may be formed in the same process as the connecting pattern CNP of the display area DA with substantially the same material. The lower contact electrode CTEa and the upper contact electrode CTEb may constitute the contact electrode CTE, and as described above, the lines may be connected to the driver, implemented as the chip on layer on the substrate SUB, through the contact electrode CTE.

The connection between the first lines L1 and the second lines L2 will be described below. The second lines L2 and the third lines L3 may be connected substantially in the same manner as the first lines L1 and the second lines L2.

For example, when the first to third lines L1 to L3 are connected to the data lines for transmitting the data signal to the pixels PXL, the first lines L1 may include a contact unit to connect to the data lines near the display area DA.

Figure 4:
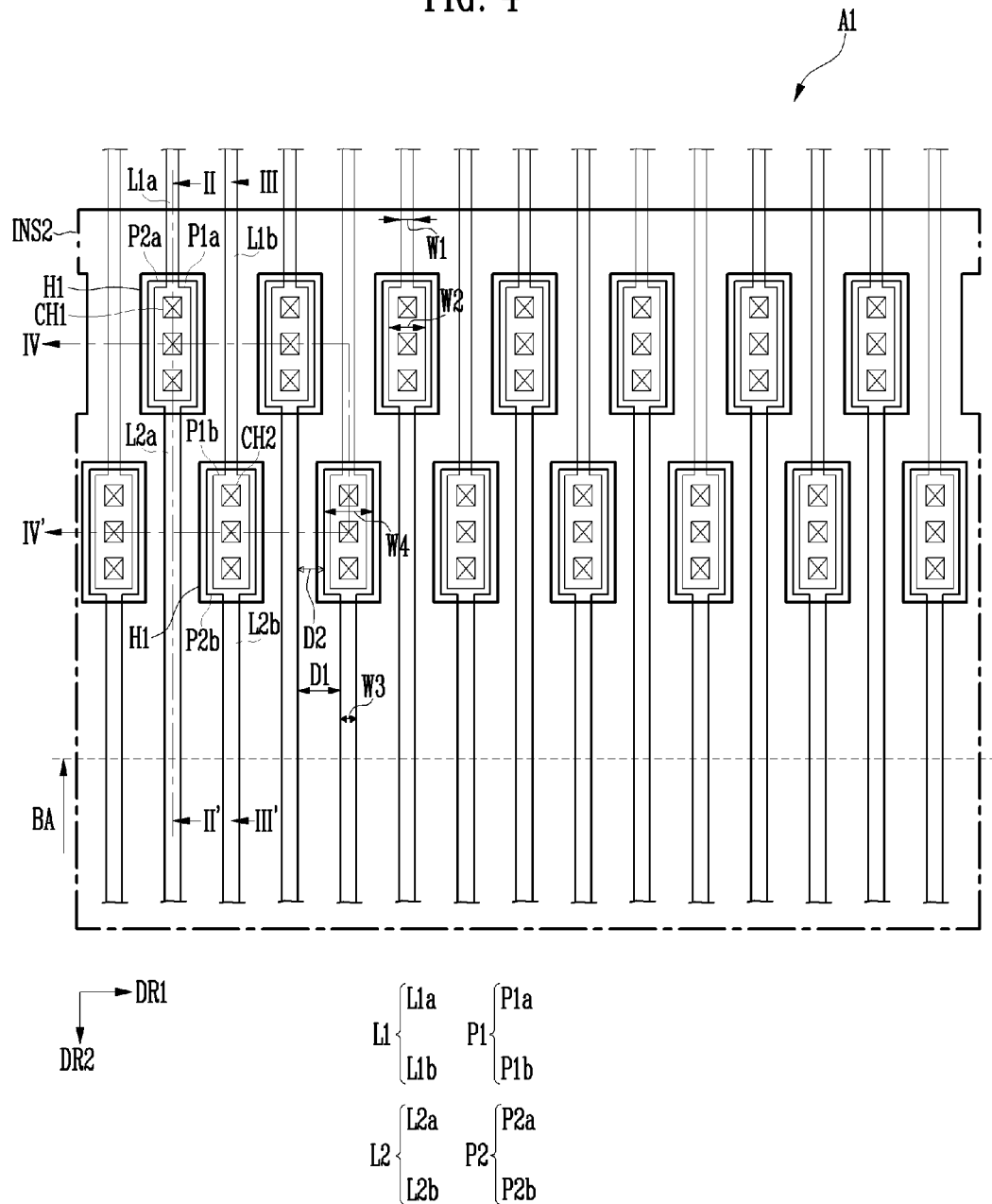
FIG. 4 is a plan view of a portion corresponding to A1 of FIG. 1 according to an exemplary embodiment of the inventive concept.
Figure 5A:
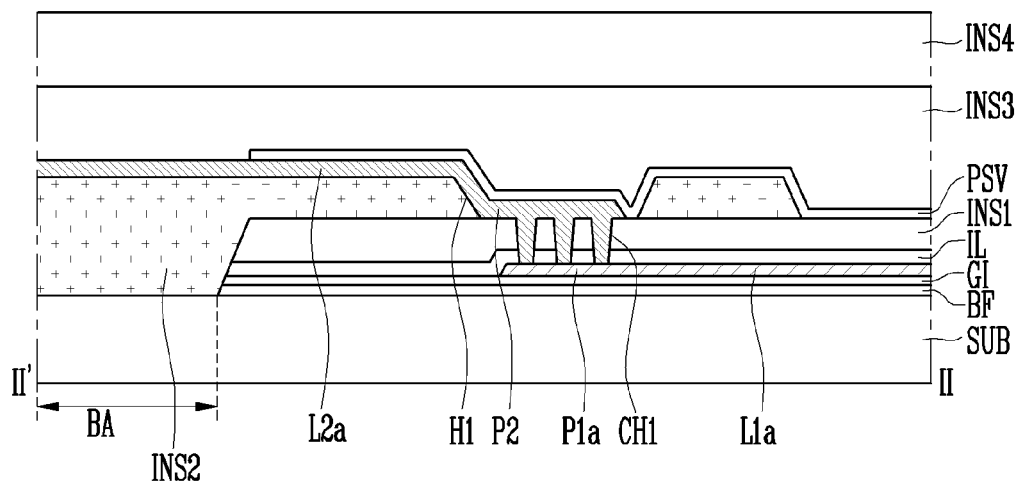
FIG. 5A is a cross sectional view taken along line II-II' of FIG. 4.
Figure 5B:
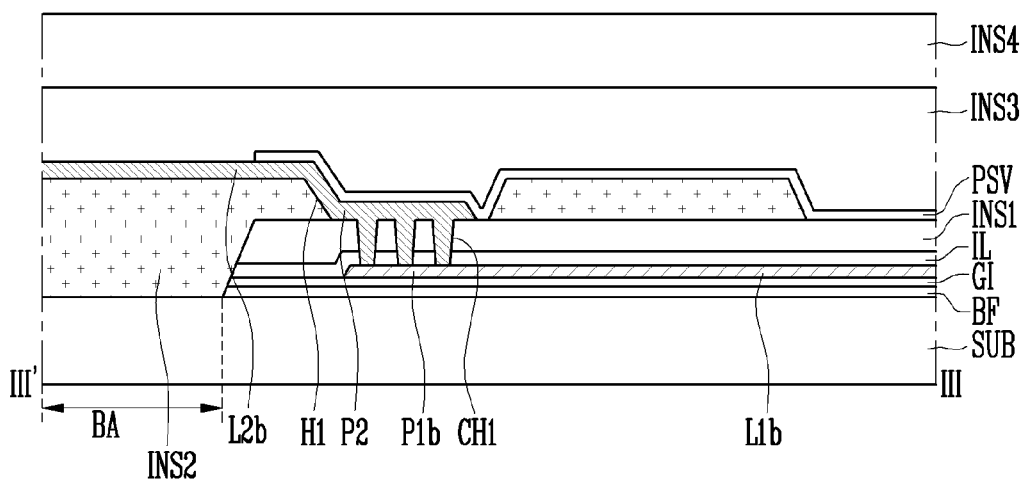
FIG. 5B is a cross sectional view taken along line III-III' of FIG. 4.

FIG. 4 is a plan view of a portion corresponding to A1 of FIG. 1 according to an exemplary embodiment of the inventive concept. FIG. 5A is a cross sectional view taken along line II-II' of FIG. 4, FIG. 5B is a cross sectional view taken along line III-III' of FIG. 4, and FIG. 5C is a cross sectional view taken along line IV-IV' of FIG. 4.

Referring to FIGS. 4 and 5A to 5C, and the line part LP may include the first lines L1 and the second lines L2. The first lines L1 and the second lines L2 may be connected to each other one to one.

The first lines L1 may generally extend in the second direction DR2 and be spaced apart from one another. Although it is illustrated in FIG. 4 that the first lines L1 are in parallel with one another, the first lines L1 are not limited thereto. As the first lines L1 extend in the second direction DR2, the distance among the first lines L1 may become smaller or larger. According to an exemplary embodiment of the inventive concept, the distance among the first lines L1 becomes smaller along the second direction DR2 and eventually the first lines L1 extend to be in parallel to maintain a predetermined distance.

Each of the first lines L1 may have a first pad P1 at the end portion in the second direction DR2. In the first lines L1, a width of the portion including the first pads P1 (e.g., a second width W2) may be greater than a width of the portion that does not include the first pads P1 (e.g., a first width W1) (a width indicates a distance in the first direction DR1). In other words, the second width W2 may be greater than the first width W1. A relatively larger width of the first pads P1 may facilitate contact with second pads P2. Alternatively, according to an exemplary embodiment of the inventive concept, the second width W2 may be substantially equal to the first width W1.

The first lines L1 may include first sub-lines L1a and second sub-lines L1b. A plurality of first sub-lines L1a and a plurality of second sub-lines L1b may be provided and alternately arranged in the first direction DR1. For example, the first sub-lines L1a may be odd numbered lines of the first lines L1, and the second sub-lines L1b may be even numbered line of the first lines L1. Alternatively, the first sub-lines L1a may the even numbered line of the first lines L1, and the second sub-lines L1b may be odd numbered lines of the first lines L1.

The first pads P1 include first sub-pads P1a and second sub-pads P1b that may be included in the end portions of the first sub-lines L1a and the second sub-lines L1b, respectively. The first sub-pads P1a and the second sub-pads P1b may be arranged with different distances from the display area DA along the second direction DR2. In other words, a minimum distance from the display area DA of the first sub-pad P1a may be shorter than a minimum distance from the display area DA of the second sub-pad P1b. The minimum distance from the display area DA of the first sub-pad P1a and the minimum distance from the display area DA of the second sub-pad P1b may be determined based on a length of the first sub-pads P1a and the second sub-pads P1b in the second direction DR2.

The first sub-lines L1a and the second sub-lines L1b may be provided on the same layer. According to an exemplary embodiment of the inventive concept, the first sub-lines L1a and the second sub-lines L1b may be provided on the gate insulating layer GI, along with the gate electrode GE and the capacitor lower electrode LE. The first sub-lines L1a and the second sub-lines L1b may be formed in the same process as the gate electrode GE and the capacitor lower electrode LE with substantially the same material.

The second lines L2 may substantially extend in the second direction DR2 and be separated from each other. Although the second lines L2 are illustrated in FIG. 4 to be parallel to each other, the second lines L2 are not limited thereto. As the second lines L2 extend in the second direction DR2, the distance among the second lines L2 may be widened or tapered.

Each of the second lines L2 may have a second pad P2 in an end portion nearest to the bendable area BA. A portion of the second lines L2 without the second pad P2 has a third width W3. The second pad P2 has a fourth width W4. The fourth width W4 may be greater than the third width W3.

The fourth width W4 of the second pads P2 may be relatively large to facilitate contact with the first pads P1. Alternatively, according to an exemplary embodiment of the inventive concept, the fourth width W4 may be substantially equal to the third width W3 if needed.

As described above, the second width W2 may be greater than the first width W1 and the fourth width W4 may be greater than the third width W3. In other words, widths of the first and second pads P1 and P2 (e.g., W2 and W4) may be greater than widths of portions of the first and second lines L1 and L2 where the first and second pads are not overlapped (e.g., W1 and W3). Alternatively, as described above, the second width W2 may be substantially equal to the first width W1 and the fourth width W4 may be substantially equal to the third width W3. In other words, widths of the first and second pads P1 and P2 (e.g., W2 and W4) may be substantially the same as widths of portions of the first and second lines L1 and L2 where the first and second pads are not overlapped (e.g., W1 and W3).

The second lines L2 may include third sub-lines L2a corresponding to the first sub-lines L1a of the first lines L1 and fourth sub-lines L2b corresponding to the second sub-lines L1b of the first lines L1. A plurality of third sub-lines L2a and a plurality of fourth sub-lines L2b may be alternately arranged along the first direction DR1. In other words, the third sub-lines L2a may be odd numbered lines of the second lines L2, and the fourth sub-lines L2b may be even numbered lines of the second lines L2. Alternatively, the third sub-lines L2a may be even numbered line of the second lines L2, and the fourth sub-lines L2b may be odd numbered lines of the second lines L2.

The second pads P2 include third sub-pads P2a and fourth sub-pads P2b. The third sub-lines L2a and the fourth sub-lines L2b may include the third sub-pads P2a and the fourth sub-pads P2b, respectively, in the end portions nearest to the bendable area BA. The third sub-pads P2a may correspond to the first sub-pads P1a of the first sub-lines L1a, and the fourth sub-pads P2b may correspond to the second sub-pads P1b of the second sub-lines L1b.

When viewed in a plan view, the third sub-pads P2a may overlap with the first sub-pads P1a and the fourth sub-pads P2b may overlap with the second sub-pads P1b. Accordingly, the third sub-pads P2a and the fourth sub-pads P2b may correspond to the positions of the first sub-pads P1a and the second sub-pads P1b, respectively, and may be formed to have different distances from the display area DA along the second direction DR2. In other words, a shortest distance from the display area DA of the third sub-pads P2a may be shorter than a shortest distance from the display area of DA of the fourth sub-pads P2b.

According to an exemplary embodiment of the inventive concept, the third sub-lines L2a and the fourth sub-lines L2b may be provided on the same layer. The third sub-lines L2a and the fourth sub-lines L2b may be provided on the first insulating layer INS1 and the second insulating layer INS2, along with the source electrode SE and the drain electrode DE of the display area DA. The third sub-lines L2a and the fourth sub-lines L2b may be formed in the same process with substantially the same material as the source electrode SE and the drain electrode DE.

A width of each of the second pads P2 may be substantially the same as a width of each of the first pads P1, or may be different. In FIG. 4, for convenience of explanation, the width of the second pad P2 is slightly greater than the width of the first pad P1. For example, according to an exemplary embodiment of the inventive concept, the width of the second pad P2 may be substantially the same as the width of the first pad P1.

The second lines L2 may be provided between the second insulating layer INS2 and the third insulating layer INS3.

The second lines L2 and the first lines L1 may correspond one to one and extend in a direction in which the first lines L1 extend. When viewed in a plan view, the end portion of the first lines L1 and the end portion of the second lines L2 may overlap with each other. According to an exemplary embodiment of the inventive concept, the first pad P1 of the first lines L1 and the second pad P2 of the second lines L2 may overlap with each other.

In an area in which the first sub-pads P1a and the third sub-pads P2a are formed and an area in which the second sub-pads P1b and the fourth sub-pads P2b are formed, a first contact hole CH1 penetrating through the insulating interlayer IL and the first insulating layer INS1 may be provided. The first contact hole CH1 may be provided in at least one or more of overlapping portions of the sub-pads. According to an exemplary embodiment of the inventive concept, three first contact holes CH1 are illustrated in FIGS. 5A to 5C.

A first hole H1 may be provided in a position corresponding to the first sub-pads P1a and the second sub-pads P1b in the second insulating layer INS2. The first hole H1 may expose the upper surfaces of the first sub-pads P1a and the second sub-pads P1b. The first hole H1 may be formed to correspond to the first sub-pads P1a and the second sub-pads P1b and has a greater area than the area of each first sub-pad P1a and each second sub-pad P1b.

Accordingly, a portion of the second pads P2 (e.g., the third sub-pads P2a) may be in contact with the first sub-pads P1a exposed by the first contact hole CH1 and the first hole H1, and the remaining portion of the second pads P2 (e.g., the fourth sub-pads P2b) may be in contact with the second sub-pads P1b exposed by the first contact hole CH1 and the first hole H1. As a result, the first sub-pads P1a and the third sub-pads P2a may be electrically connected to each other and the second sub-pads of P1b and the fourth sub-pads P2b may be electrically connected to each other.

When viewed in a plan view, the edge of the second insulating layer INS2 may be provided between the display area DA and a portion in which the first lines L1 overlap the second lines L2. The edge of the second insulating layer INS2, when viewed in a plan view, may indicate an outermost boundary or side of the second insulating layer INS2, not including a remaining portion of the second insulating layer INS2 formed by the first hole H1 (e.g., the portion of the second insulating layer INS2 furthest from the bendable area BA as shown in FIG. 5A).

In the display device according to an exemplary embodiment of the inventive concept, the edge of the second insulating layer INS2, the first sub-pads P1a and the third sub-pads P2a, and the second sub-pads P1b and the fourth pads P2b may be arranged sequentially along the second direction DR. Accordingly, an overlapping portion of the first sub-pads P1a and the third sub-pads P2a and an overlapping portion of the second sub-pads P1b and the fourth sub-pads P2b may be spaced from the edge of the second insulating layer INS2. According to an exemplary embodiment of the inventive concept, the edge of the second insulating layer INS2 may be spaced apart from the overlapping portion of the first sub-pads P1a and the third sub-pads P2a by at least one micrometer.

The line part LP having the above structure may prevent shorts from occurring due to residue that may be generated during the formation of the line part LP.

Conventionally, the overlapping portions of the first lines L1 and the second lines L2, e.g., the first pads P1 and the second pads P2, may be arranged to have the same minimum distance from the display area DA. In addition, the edge of the second insulating layer INS2 may partially overlap with at least a portion of the first pads P1 and the second pads P2. With respect to the first pads P1 and the second pads P2, since the width of the pads is greater than other portions of the lines so that the distance between adjacent pads is relatively small, the short distance between adjacent pads may result in residue.

However, as described above, according to an exemplary embodiment of the inventive concept, the first and the third sub-pads P1a and P2a and the second and fourth sub-pads P1b and P2b may be arranged with different distances from the display area DA along the second direction DR2, thus maximizing the space between adjacent pads.

The second insulating layer INS2 may be manufactured by applying an organic material thereto, and a portion in which the second insulating layer INS2 is provided and a portion in which the second insulating layer INS2 is not provided may be placed at different heights from the substrate SUB. When forming the first pads and the second pads P1 and P2 with the metal material, etc. at the height from the substrate SUB caused by the second insulating layer INS2, metal residue that was not yet removed may remain at the edge of the second insulating layer INS2. The metal residue may short the first and second lines L1 and L2 adjacent to each other, causing defects to occur in the display device.

Referring to FIG. 4, with respect to the third sub-lines L2a, a first distance D1 is a minimum distance to the nearest of the second lines L2 in an area in which the fourth sub-pads P2b are not provided and a second distance D2 is a minimum distance to the nearest of the second lines L2 in an area in which the fourth sub-pads P2b are provided. The second distance D2 may be smaller than the first distance D1.

Since the edge of the second insulating layer INS2 is spaced apart from the third sub-pads P2a where the space between the lines (e.g., the second lines L2) is relatively narrow, a short between the lines may be reduced or prevented even though metal residue may remain. In this case, the metal residue may be located in the conductive layer that is floated on the edge of the second insulating layer INS2.

According to an exemplary embodiment of the inventive concept, in the overlapping portion of the first lines L1 and the second lines L2, to reduce or prevent short circuits between adjacent lines, the first lines L1 may be arranged differently. In the exemplary embodiments described below, repeat descriptions will be omitted to avoid redundancy.

Figure 6:
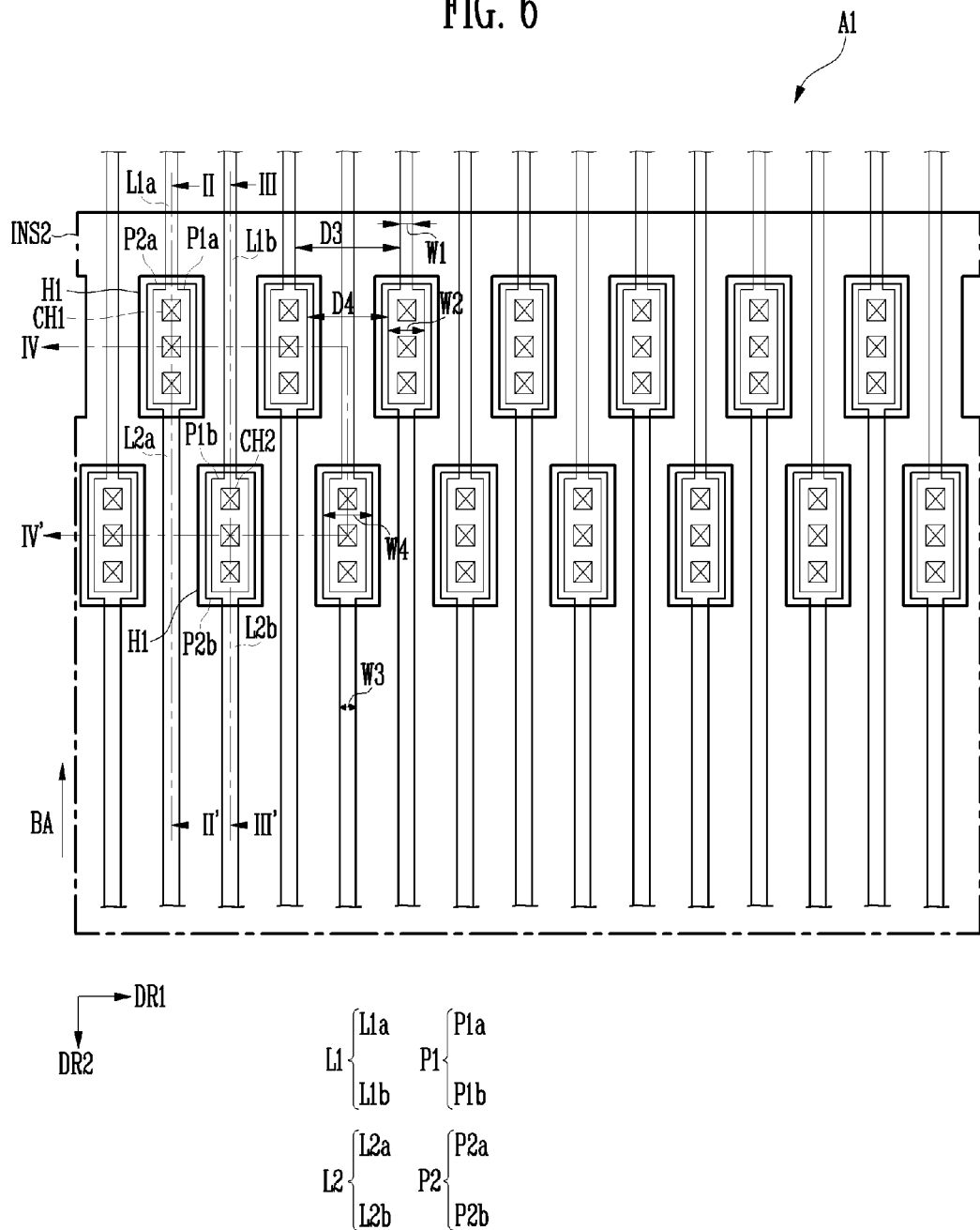
FIG. 6 is a plan view of a portion corresponding to A1 of a display device of FIG. 1 according to an exemplary embodiment of the inventive concept.
Figure 7A:
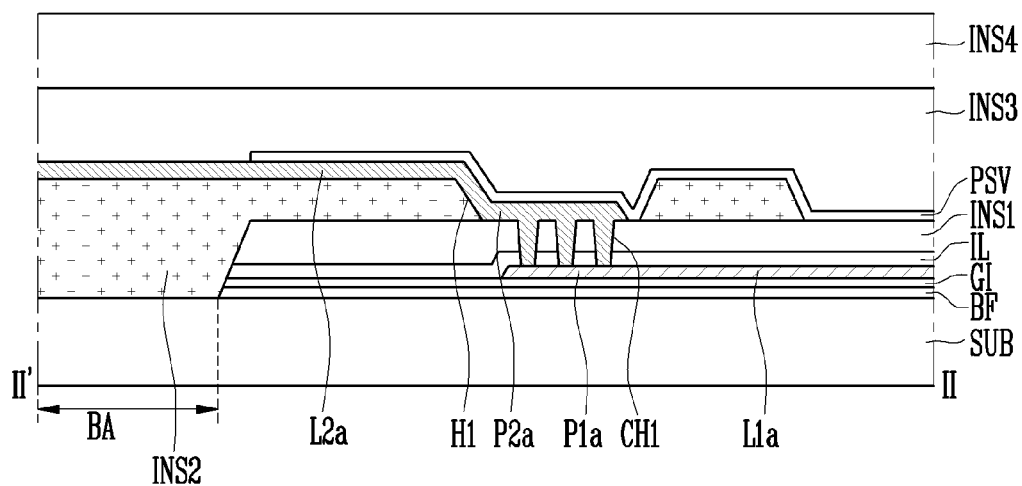
FIG. 7A is a cross sectional view taken along line II-II' of FIG. 6.
Figure 7B:
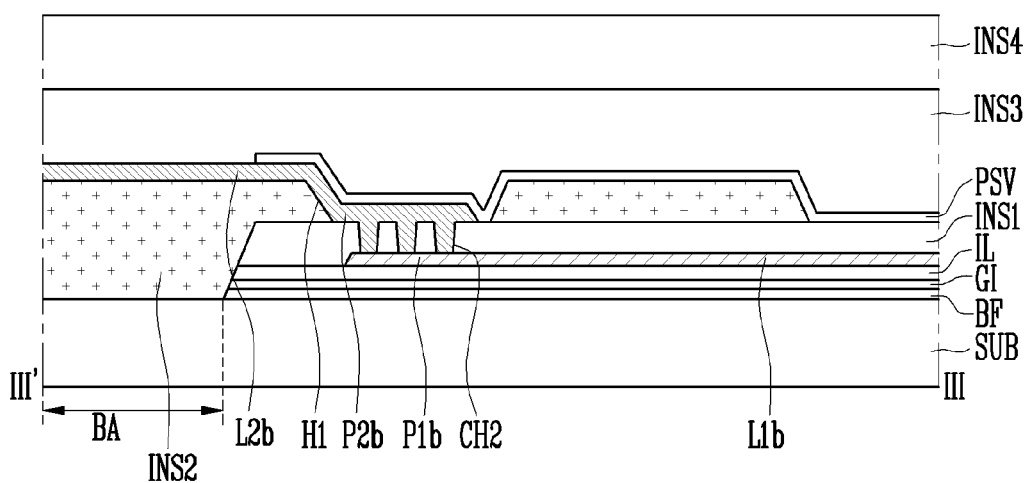
FIG. 7B is a cross sectional view taken along line III-III' of FIG. 6.

FIG. 6 is a plan view of a portion corresponding to A1 of a display device of FIG. 1 according to an exemplary embodiment of the present disclosure. FIG. 7A is a cross sectional view taken along line II-II' of FIG. 6, FIG. 7B is a cross sectional view taken along line III-III' of FIG. 6, and FIG. 7C is a cross sectional view taken along line IV-IV' of FIG. 6.

Referring to FIGS. 6 and 7A to 7C, the line part LP may include includes the first lines L1 and the second lines L2. The first lines L1 and the second lines L2 may be connected to correspond one to one.

The first lines L1 may include the first sub-lines L1a and the second sub-lines L1b. The first sub-lines L1a and the second sub-lines L1b may be arranged alternately along the first direction DR1. The first sub-lines L1a and the second sub-lines L1b may include the first sub-pads P1a and the second sub-pads P1b, respectively, on end portions thereof.

In the present exemplary embodiment, the first sub-lines L1a and the second sub-lines L1b are formed on different layers and are alternately arranged in the first direction DR1.

The first sub-lines L1a may be provided on the gate insulating layer GI with the gate electrode GE of the display area DA and the capacitor lower electrode LE. The first sub-lines L1a may be formed in the same process as the gate electrode GE and the capacitor lower electrode LE with substantially the same material.

The second sub-lines L1b may be provided on the insulating interlayer IL with the capacitor upper electrode UE of the display area DA. The second sub-lines L1b may be formed in the same process as the capacitor upper electrode UE with substantially the same material.

The second lines L2 may include the third sub-lines L2a corresponding to the first sub-lines L1a and the fourth sub-lines L2b corresponding to the second sub-lines L1b. The third sub-lines L2a and the fourth sub-lines L2b may include the third sub-pads P2a and the fourth sub-pads P2b, respectively, at the end portions thereof nearest to the bendable area BA.

The third sub-lines L2a and the fourth sub-lines L2b may be provided on the same layer. The third sub-lines L2a and the fourth sub-lines L2b may be provided on the first insulating layer INS1 and the second insulating layer INS2 with the source electrode SE and the drain electrode DE of the display area DA. The third sub-lines L2a and the fourth sub-lines L2b may be formed in the same process as the source electrode SE and the drain electrode DE with substantially the same material.

The second lines L2 and the first lines L1 may correspond one on one. The first pad P1 of the first lines L1 and the second pad P2 of the second lines L may overlap with each other.

In an area in which the first sub-pads P1a is formed, the first contact hole CH1 penetrating through the insulating interlayer IL and the first insulating layer INS1 may be provided. At least one first contact hole CH1 may be provided. According to an exemplary embodiment of the inventive concept, three first contact holes CH1 are provided.

In an area in which the second sub-pads P1b are formed, a second contact hole CH2 penetrating through the first insulating layer INS1 may be provided. At least one second contact hole CH2 may be provided. According to an exemplary embodiment of the inventive concept, three second contact holes CH2 are provided.

The first hole H1 may be provided in a position corresponding to the first sub-pads P1a and the second sub-pads P1b in the second insulating layer INS2.

Accordingly, a portion of the second pads P2 (e.g., the third sub-pads P2a) may be in contact with the first sub-pads P1a exposed by the first contact hole CH1 and the first hole H1, and a remaining portion of the second pads P2 (e.g., the fourth sub-pads P2b) may be in contact with the second sub-pads P1b exposed by the second contact hole CH2 and the first hole H1. As a result, the first sub-pads P1a and the third sub-pads P2a are electrically connected to each other and the second sub-pads P1b and the fourth sub-pads P2b are electrically connected to each other.

When viewed in a plan view, the edge of the second insulating layer INS2 may be provided between the display area DA and the overlapping portion of the first lines L1 and the second lines L2. An overlapping portion of the first sub-pads P1a and the third sub-pads P2a and an overlapping portion of the second sub-pads P1b and the fourth sub-pads P2b may be spaced from the edge of the second insulating layer INS2.

Since the first sub-lines L1a and the second sub-lines L1b have the above described structure, a greater width may be established between adjacent lines among the first lines L1. When the first lines L1 are alternately formed on a single layer, spaces between adjacent first lines L1 is small. However, when the first lines L1 are alternately arranged on different layers, spaces between adjacent first lines L1 may be wider. As a result, the degree of freedom in designing the first lines L1 may increase.

In FIG. 6, with respect to the first sub-lines L1a, the most adjacent lines on the same layer may not be the second sub-lines L1b, but other first sub-lines L1a. The second sub-lines L1b may be on a different layer from the first sub-lines L1a.

A third distance D3 may be a distance between adjacent first sub-lines L1a where the first sub-pad P1a is not provided. A fourth distance D4 may be a distance between adjacent first sub-lines L1a where the first sub-pad P1a is provided. The fourth distance D4 may be smaller than the third distance D3. In addition, when viewed in a plan view, spaces between adjacent lines may be larger since the first sub-lines L1a and the second sub-lines L1b are provided on different layers. As described above, according to an exemplary embodiment of the inventive concept, more lines may be arranged in a narrower area because the lines are provided on different layers, and the degree of the freedom in design increases.

According to an exemplary embodiment of the inventive concept, in the overlapping portion of the first lines L1 and the second lines L2, shorts between adjacent lines may be reduced or prevented, as described above.

Figure 8:
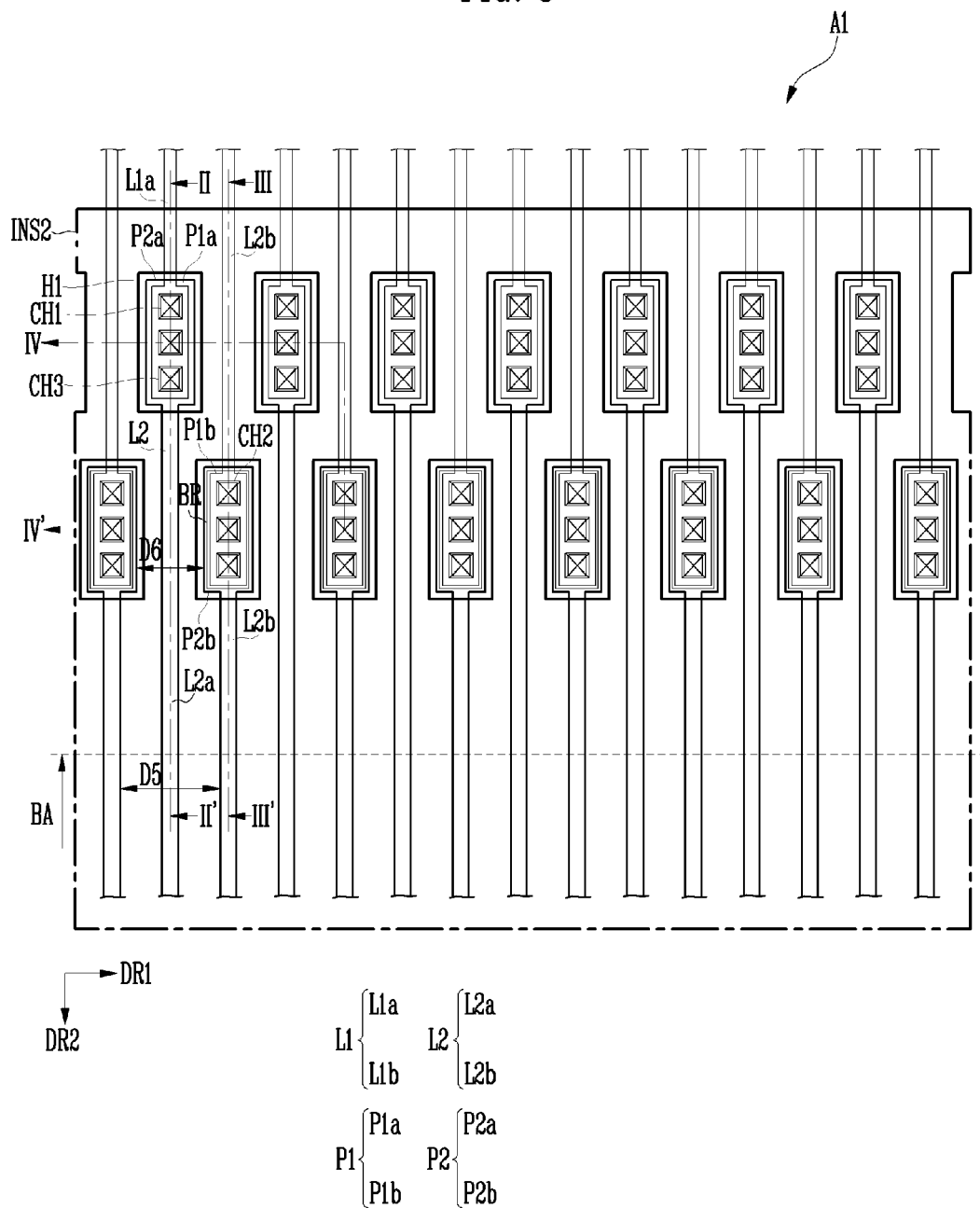
FIG. 8 is a plan view of a portion corresponding to A1 of a display device of FIG. 1 according to an exemplary embodiment of the inventive concept.
Figure 9A:
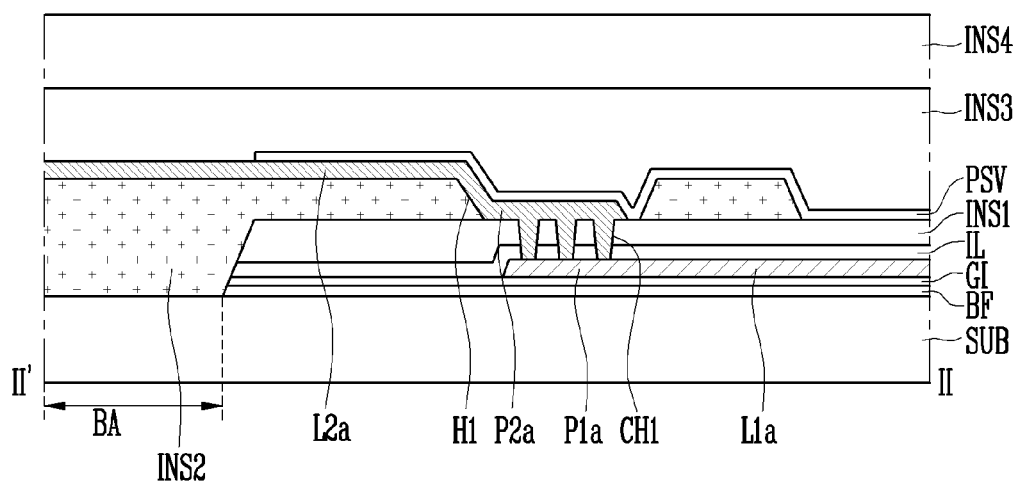
FIG. 9A is a cross sectional view taken along line II-II' of FIG. 8.
Figure 9B:
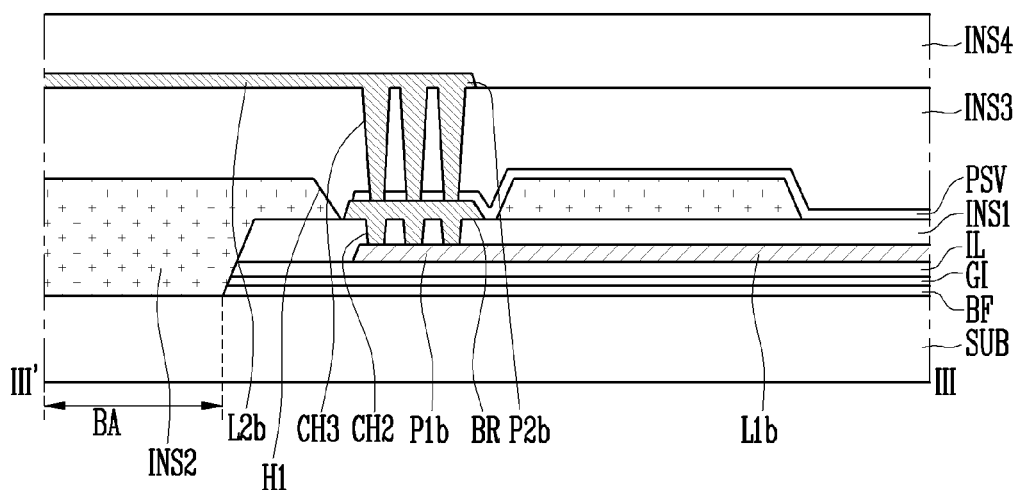
FIG. 9B is a cross sectional view taken along line III-III' of FIG. 8.
Figure 9C:
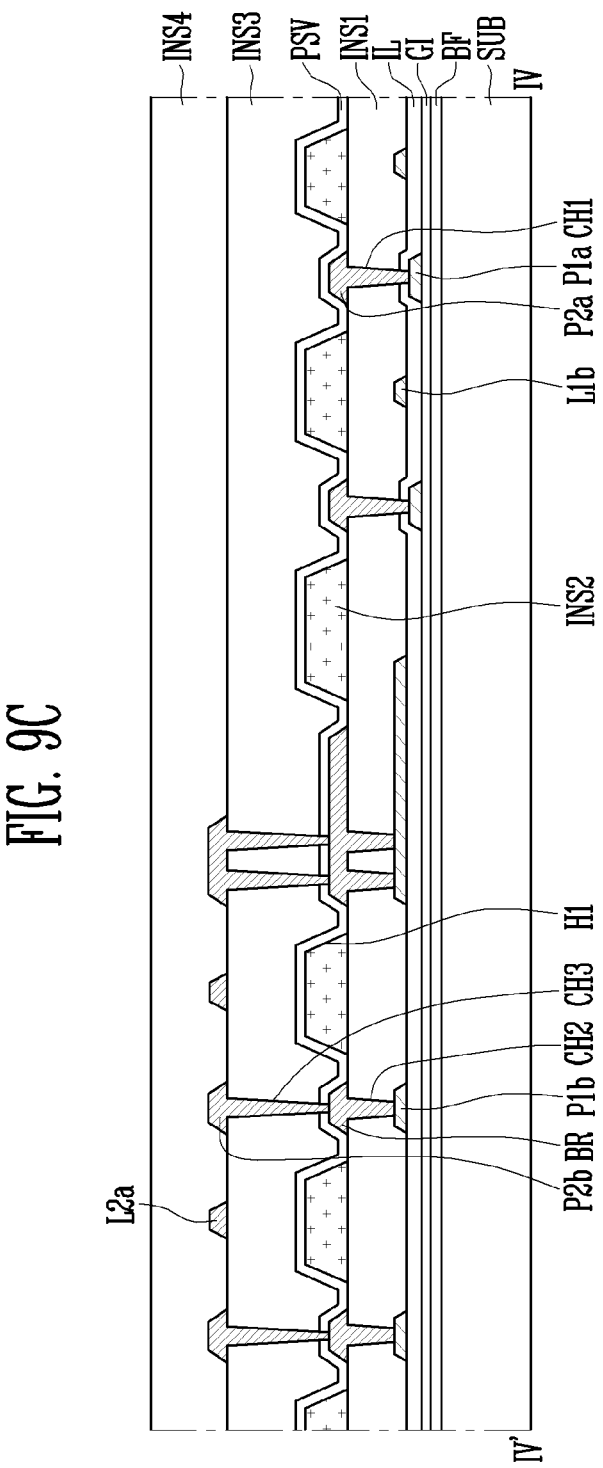
FIG. 9C is a cross sectional view taken along line IV-IV' of FIG. 8 according to exemplary embodiments of the inventive concept.

FIG. 8 is a plan view of a portion corresponding to A1 of a display device of FIG. 1 according to an exemplary embodiment of the inventive concept. FIG. 9A is a cross sectional view taken along line II-II' of FIG. 8, FIG. 9B is a cross sectional view taken along line III-III' of FIG. 8, and FIG. 9C is a cross sectional view taken along line IV-IV' of FIG. 8.

Referring to FIGS. 8 and 9A to 9C, the first lines L1 may generally extend in the second direction DR2 and may be spaced apart from each other. Each of the first lines L1 has a first pad P1 in the second direction DR2. The first pads P1 may have a greater width than a width of the first lines L1 without the first pads P1.

The first lines L1 may include the first sub-lines L1*a* and the second sub-lines L1*b*. The first sub-lines L1*a* and the second sub-lines L1*b* may be and alternately arranged along the first direction DR1. The first sub-lines L1*a* and the second sub-lines L1*b* may have the first sub-pads P1*a* and the second sub-pads P1*b*, respectively, at the end portions thereof.

The first sub-lines L1*a* may be provided on the gate insulating layer GI with the gate electrode GE and the capacitor lower electrode LE. The first sub-lines L1*a* may be formed in the same process as the gate electrode GE and the capacitor lower electrode LE with substantially the same material.

The second lines L2 may include the third sub-lines L2*a* corresponding to the first sub-lines L1*a* of the first lines L1 and the fourth sub-lines L2*b* corresponding to the second sub-lines L1*b* of the first lines L1. The third sub-lines L2*a* and the fourth sub-lines L2*b* may be alternately arranged along the first direction DR1.

The third sub-lines L2*a* and the fourth sub-lines L2*b* may be provided on different layers.

The third sub-lines L2*a* may be provided on the first insulating layer INS1 and the second insulating layer INS2 with the source electrode SE and the drain electrode DE of the display area DA. The third sub-lines L2*a* may be formed in the same process as the source electrode SE and the drain electrode DE with substantially the same material.

The fourth sub-lines L2*b* may be provided on the third insulating layer INS3 with the connecting pattern CNP of the display area DA. The fourth sub-lines L2*b* may be formed in the same process as the connecting pattern CNP with substantially the same material.

The third sub-lines L2*a* and the fourth sub-lines L2*b* may be formed on different layers and may be arranged sequentially and alternately in the first direction DR1. Accordingly, a large distance between adjacent second lines L2 may be established. When the second lines L2 are formed on a single layer, space between adjacent second lines L2 is relatively narrow. However, when the second lines L2 are alternately arranged on different layers, the distance between adjacent second lines L2 may be wider. Therefore, the freedom of design of the second lines L2 may increase.

The first contact hole CH1 penetrating the insulating interlayer IL and the first insulating layer INS1 may be provided in an area in which the first sub-pads P1*a* are formed. The second contact hole CH2 penetrating the first insulating layer INS1 may be provided in an area in which the second sub-pads P1*b* are formed.

The first hole H1 may be provided in a position corresponding to the first sub-pads P1*a* and the second sub-pads P1*b* in the second insulating layer INS2. The first hole H1 may expose the upper surface of the first sub-pads P1*a* and the second sub-pads P1*b*.

The third sub-pads P2*a* may contact the first sub-pads P1*a* exposed by the first contact hole CH1 and the first hole H1.

In the area in which the second sub-pads P1*b* are formed, a bridge pattern BR may be provided, which connects the second sub-pads P1*b* and the fourth sub-pads P2*b*. The bridge pattern BR may contact the second sub-pads P1*b* exposed by the second contact hole CH2 and the first hole H1.

In an area where the second sub-pads P1*b* is formed, a third contact hole CH3 may be provided, which penetrates the passivation layer PSV and the third insulating layer INS3. One or more third contact holes CH3 may be provided. According to an exemplary embodiment of the inventive concept, three third contact holes CH3 are provided.

Accordingly, the fourth sub-pads P2*b* may contact the bridge pattern BR through the third contact hole CH3, and the bridge pattern BR may contact the second sub-pads P1*b* through the second contact hole CH2. As a result, the second sub-pads P1*b* may be electrically connected to the fourth sub-pads P2*b*.

According to an exemplary embodiment of the inventive concept, when viewed in a plan view, the edge of the second insulating layer INS2 may be provided between the display area DA and an overlapping portion of the first lines L1 and second lines L2. The line part LP having such a structure may prevent shorts caused by residue that may be generated when the line part LP is formed.

In addition, referring to FIG. 8, with respect to the fourth sub-lines L2*b*, the most adjacent line on the same layer may not be the third sub-line L2*a*, but another fourth sub-line L2*b* because the third sub-lines L2*a* and the fourth sub-lines L2*b* are on different layers. A fifth distance D5 may be a distance between adjacent fourth sub-lines L2*b* where the fourth sub-pad P2*b* is not provided. A sixth distance D6 may be a distance between adjacent fourth sub-lines L2*b* where the fourth sub-pad P2*b* is provided. The sixth distance D6 may be smaller than the fifth distance D5. In addition, as the third sub-lines L2*a* and the fourth sub-lines L2*b* are provided on different layers, a distance between adjacent lines on the same layer may be larger. As described above, according to an exemplary embodiment of the inventive concept, as more lines may be arranged in a narrower area, the space between adjacent lines is larger and the degree of design freedom increases accordingly.

As described above, with regard to the line part LP, the first lines L1 and the second lines L2 may be provided on various layers, and may be combined with each other without departing from the inventive concept. The lines formed on different layers may be connected to one another through the contact holes.

Figure 10:
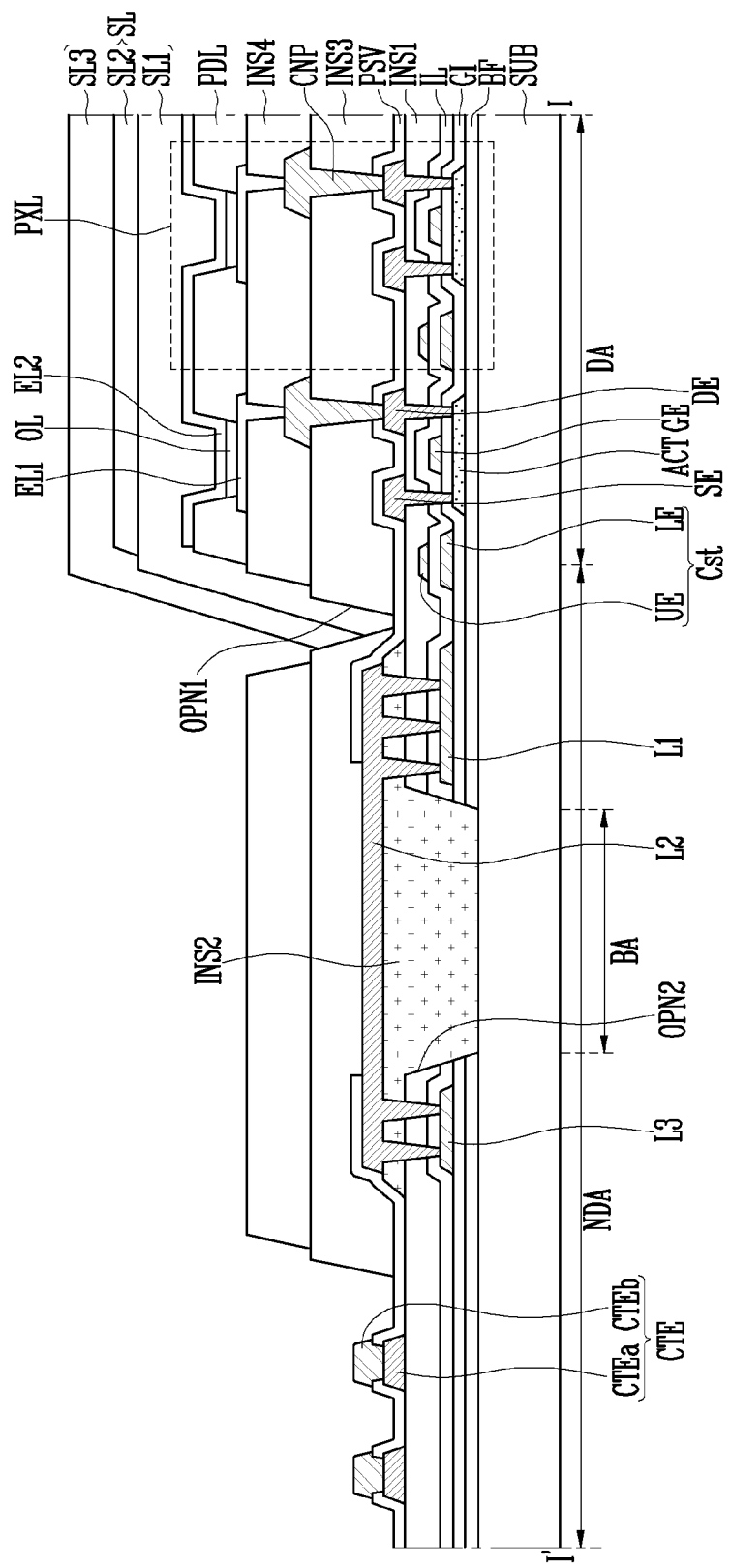
FIG. 10 is a cross sectional view taken along line I-I' of a display device of FIG. 1 according to an exemplary embodiment of the inventive concept.
Figure 11:
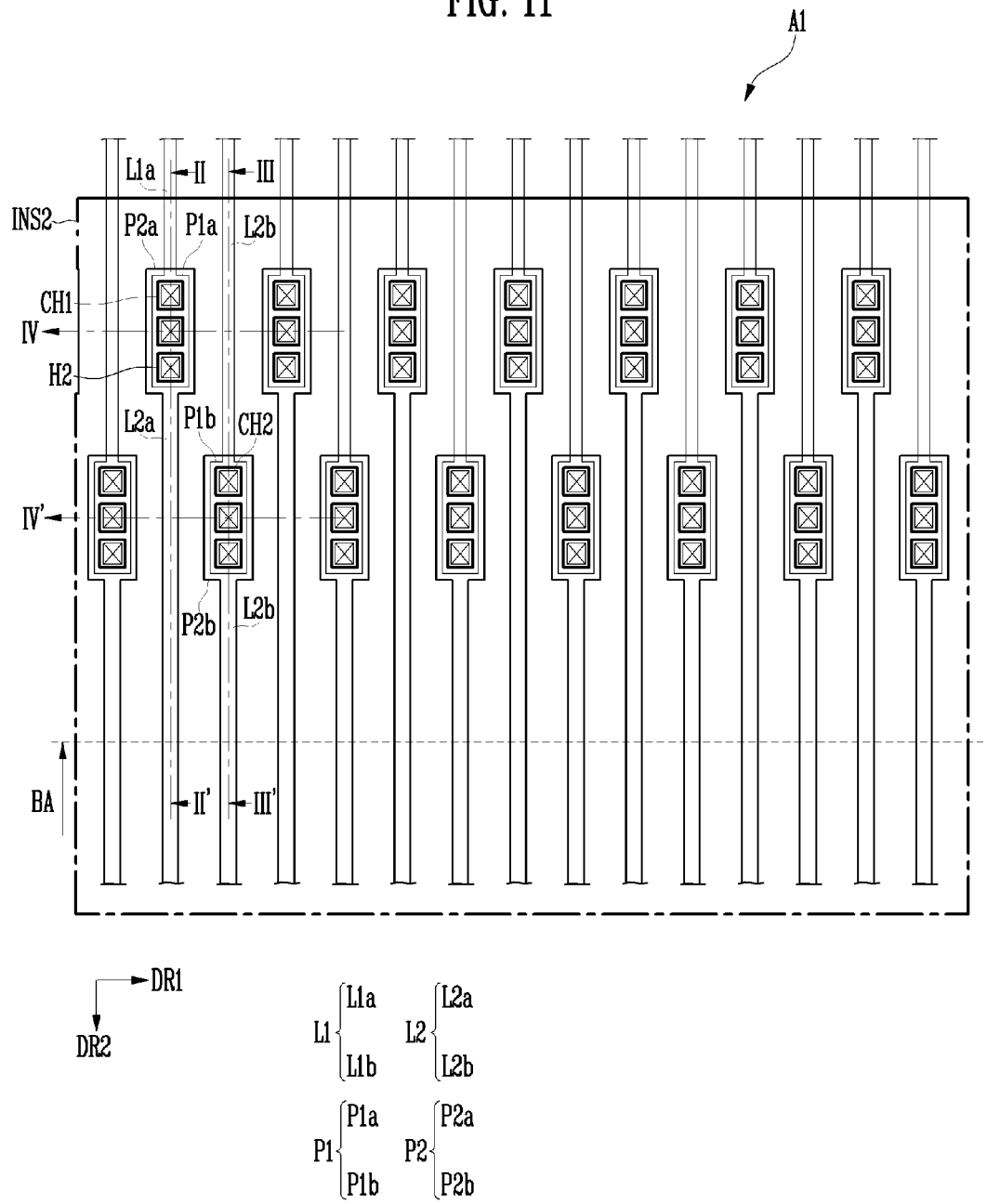
FIG. 11 is a plan view of a portion corresponding to A1 of a display device of FIG. 1 according to an exemplary embodiment of the inventive concept.
Figure 12A:
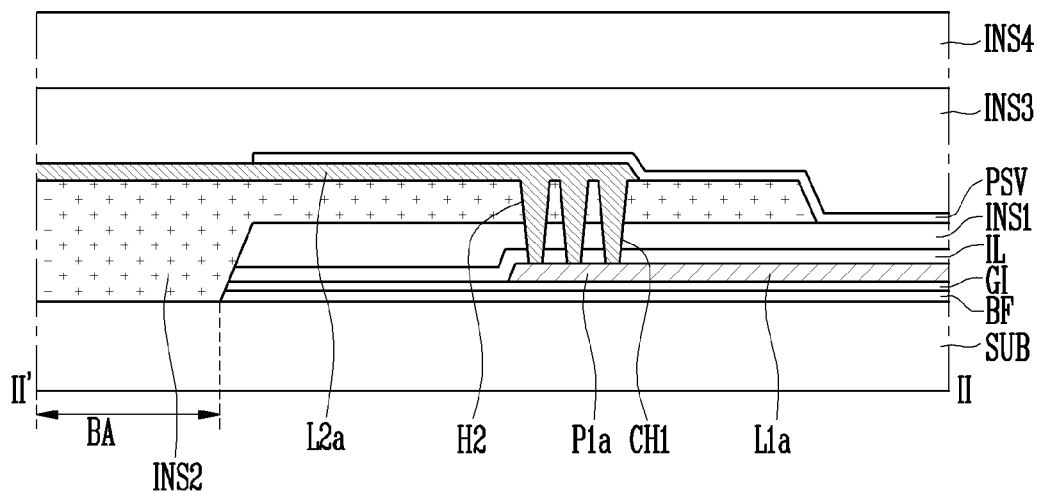
FIG. 12A is a cross sectional view taken along line II-II' of FIG. 11.
Figure 12B:
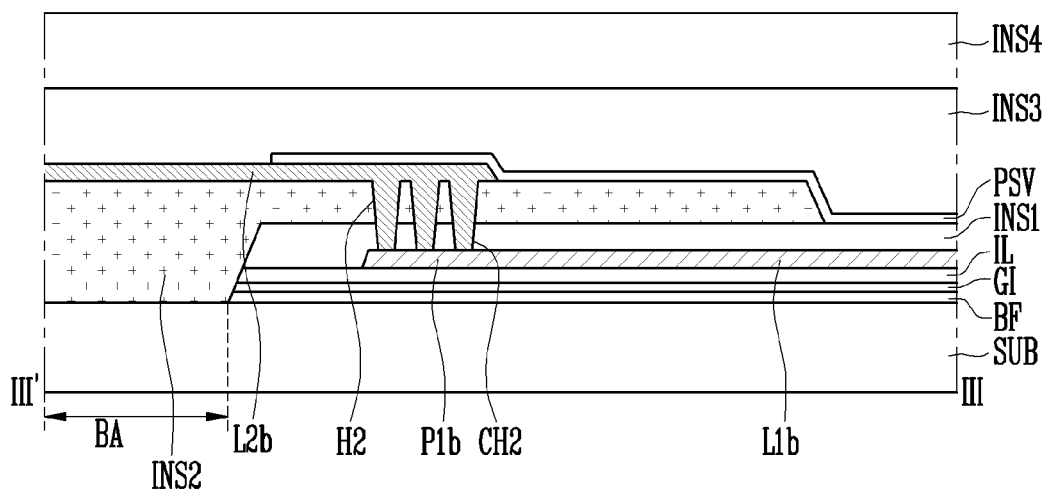
FIG. 12B is a cross sectional view taken along line III-III' of FIG. 11.
Figure 12C:
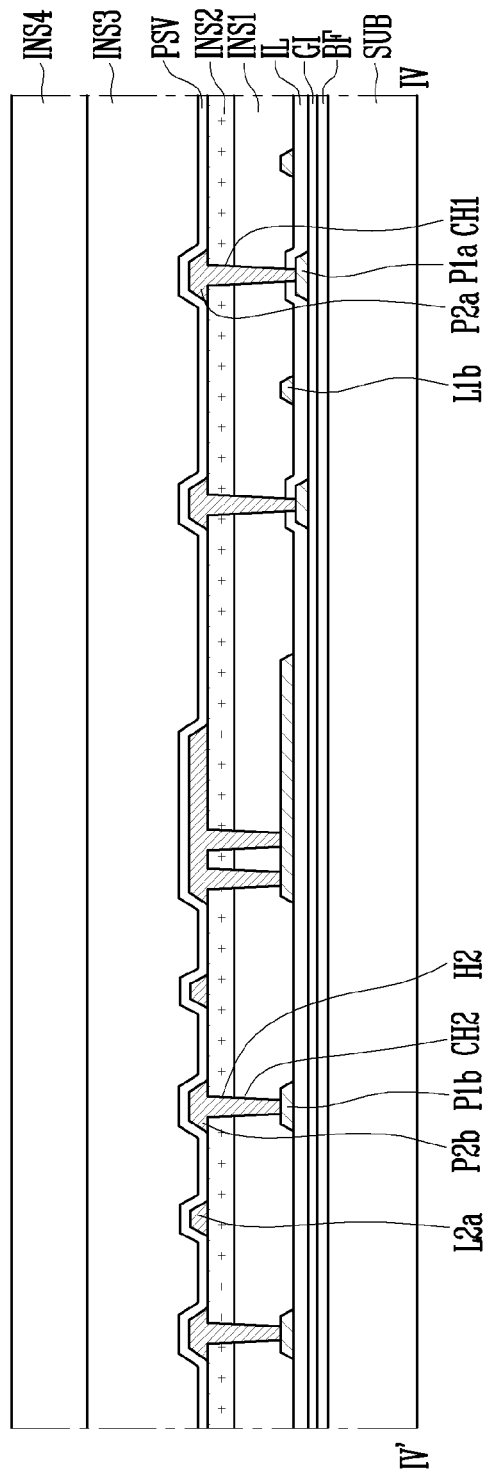
FIG. 12C is a cross sectional view taken along line IV-IV' of FIG. 11 according to exemplary embodiments of the inventive concept.

According to an exemplary embodiment of the inventive concept, the second insulating layer INS2 may be provided in various forms. For example, the hole that exposes a portion of the lines may have different shapes FIG. 10 is a cross sectional view taken along line I-I' of a display device of FIG. 1 according to an exemplary embodiment of the inventive concept. FIG. 11 is a plan view of a portion corresponding to A1 of a display device of FIG. 1 according to an exemplary embodiment of the inventive concept. FIG. 12A is a cross sectional view taken along line II-II' of FIG. 11, FIG. 12B is a cross sectional view taken along line III-III' of FIG. 11, and FIG. 12C is a cross sectional view taken along line IV-IV' of FIG. 11.

Referring to FIGS. 10, 11, and 12A to 12C, when view in a plan view, the edge of the second insulating layer INS2 may be provided between the display area DA and the overlapping portion of the first lines L1 and the second lines L2. In other words, from the display area DA in the second direction DR2, the edge of the second insulating layer INS2, the first sub-pads P1*a* and the third sub-pads P2*a*, and the second sub-pads P1*b* and the fourth sub-pads P2*b* may be sequentially arranged.

The second holes H2 may be provided in the second insulating layer INS2 in positions corresponding to the first sub-pads P1*a* and the second sub-pads P1*b*. Each second hole H2 may have a smaller area than the area of each first sub-pad P1*a* and the area of each second sub-pad P1*b*. In more detail, the second holes H2 may be provided in a position corresponding to a position in which the second contact holes CH2 are provided. In this case, when viewed in a plan view, the second holes H2 may overlap with the contact holes CH2. In FIGS. 10A to 10C, it is illustrated that the areas of the second holes H2 are slightly greater than those of the second contact holes CH2, but the inventive concept is not limited thereto. For example, the area of each of the second holes H2 may be substantially the same as the area of each of the contact holes CH2.

According to an exemplary embodiment of the inventive concept, with respect to the overlapping portion of the first lines L1 and the second lines L2, the second insulating layer may be arranged differently to reduce or prevent shorts, which will be described below.

Figure 13:
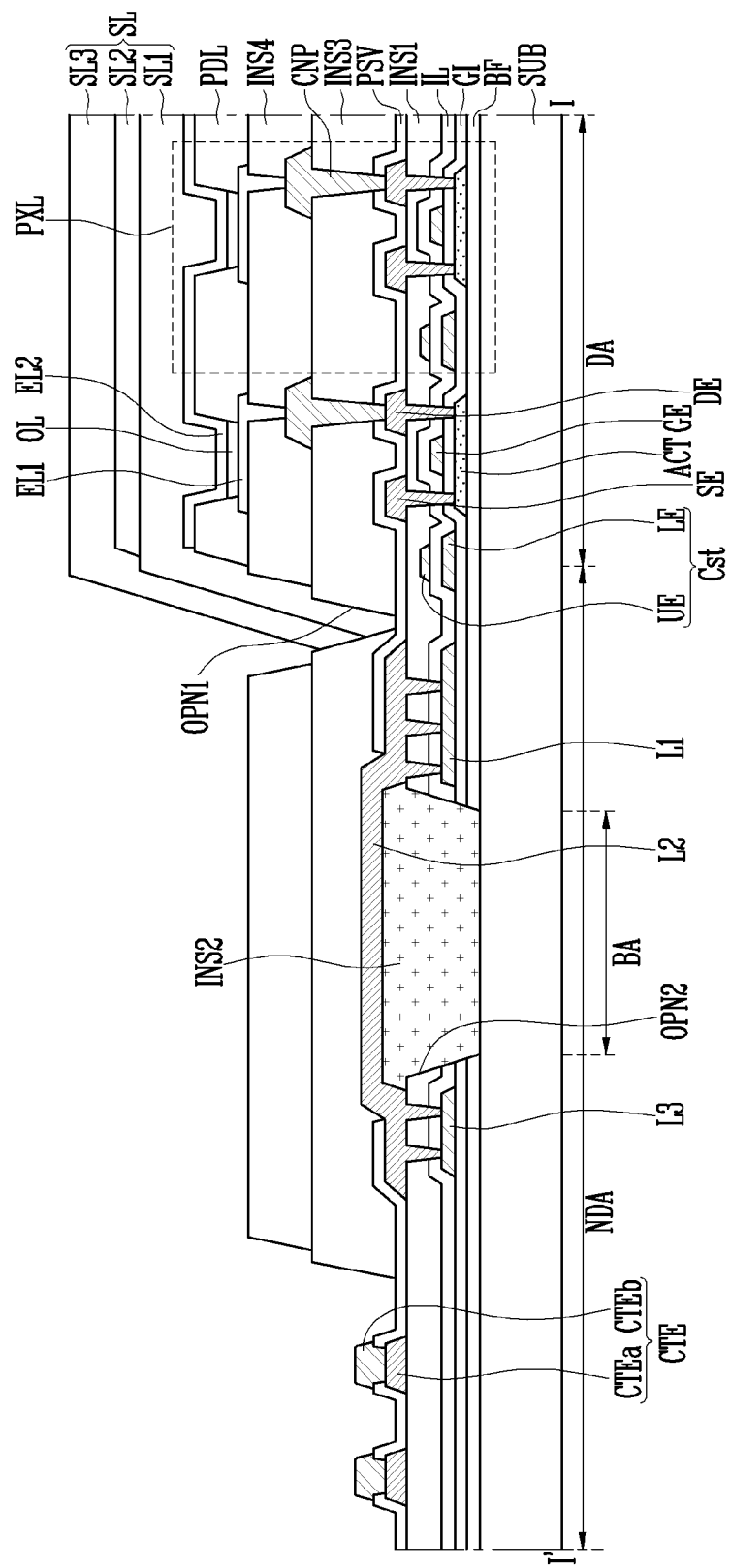
FIG. 13 is a cross sectional view taken along line I-I' of FIG. 1 in regard to a display device according to an exemplary embodiment of the inventive concept.
Figure 14:
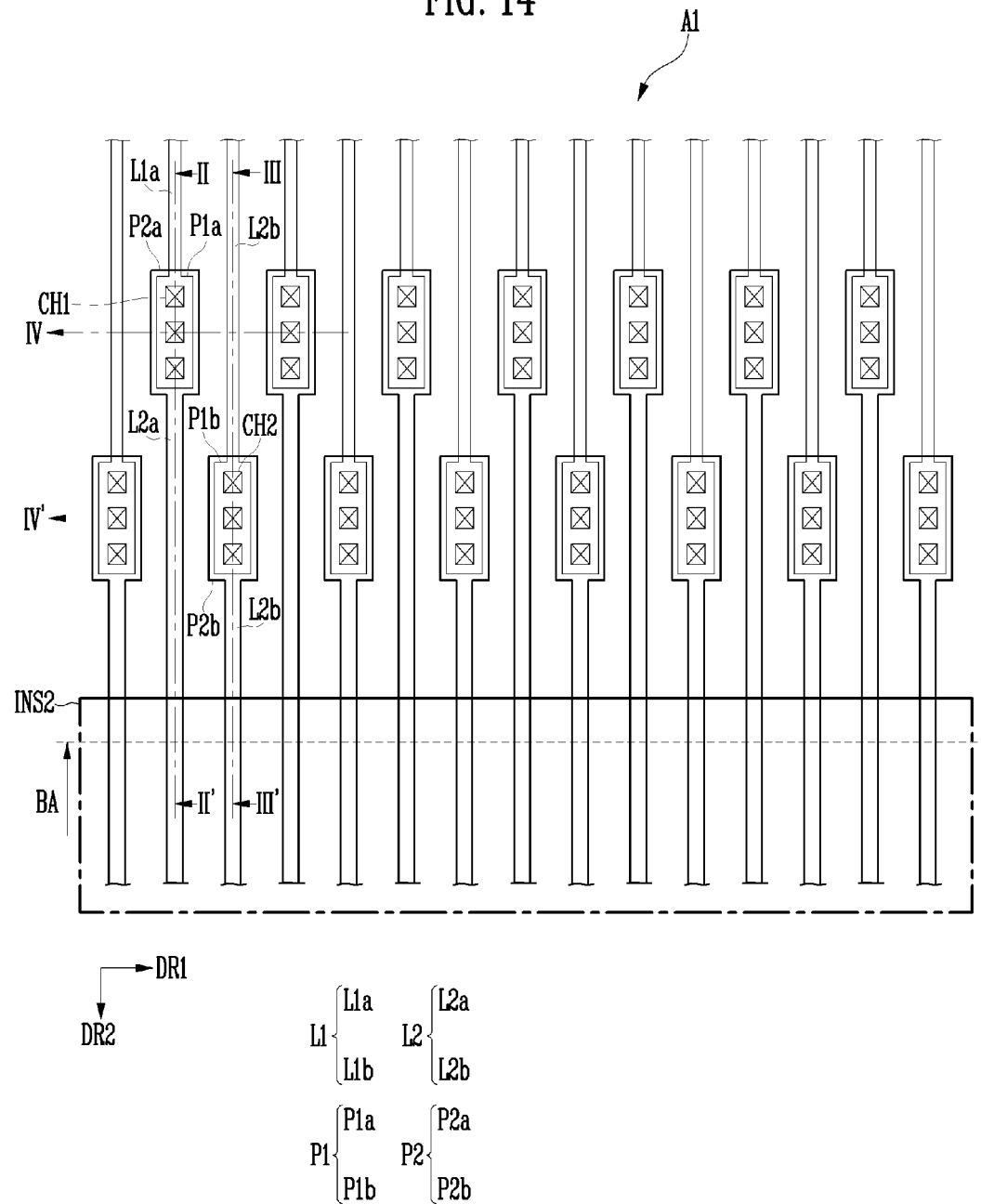
FIG. 14 is a plan view of a portion corresponding to A1 of a display device of FIG. 1 according to an exemplary embodiment of the inventive concept.
Figure 15A:
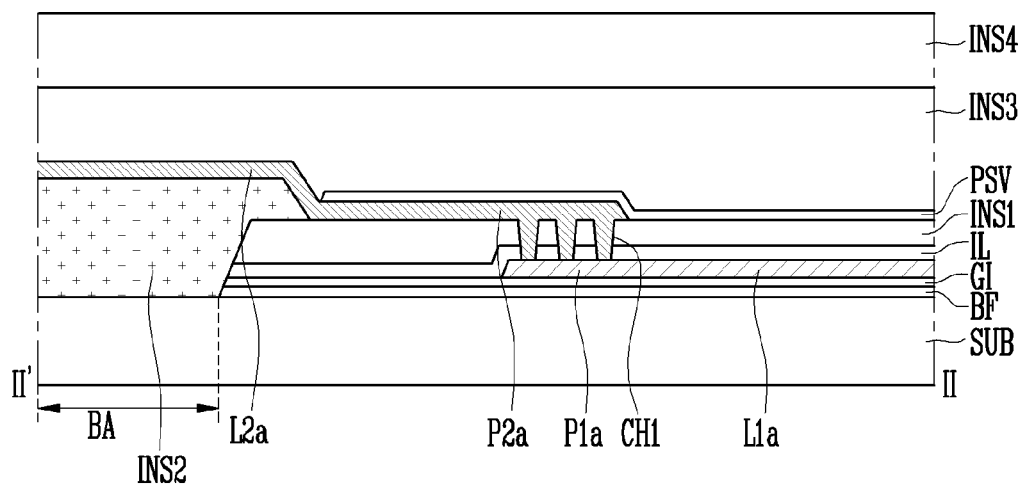
FIG. 15A is a cross sectional view taken along line II-II' of FIG. 14.
Figure 15B:
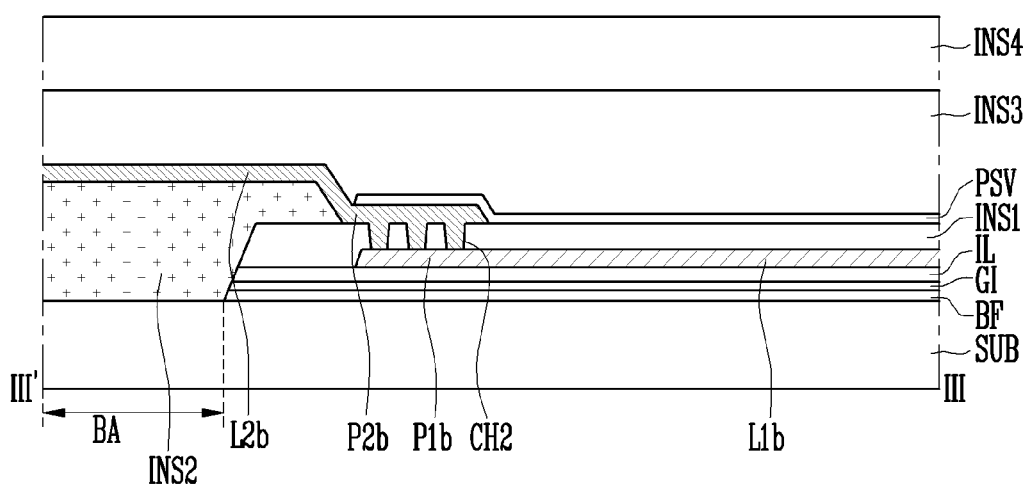
FIG. 15B is a cross sectional view taken along line III-III' of FIG. 14.
Figure 15C:
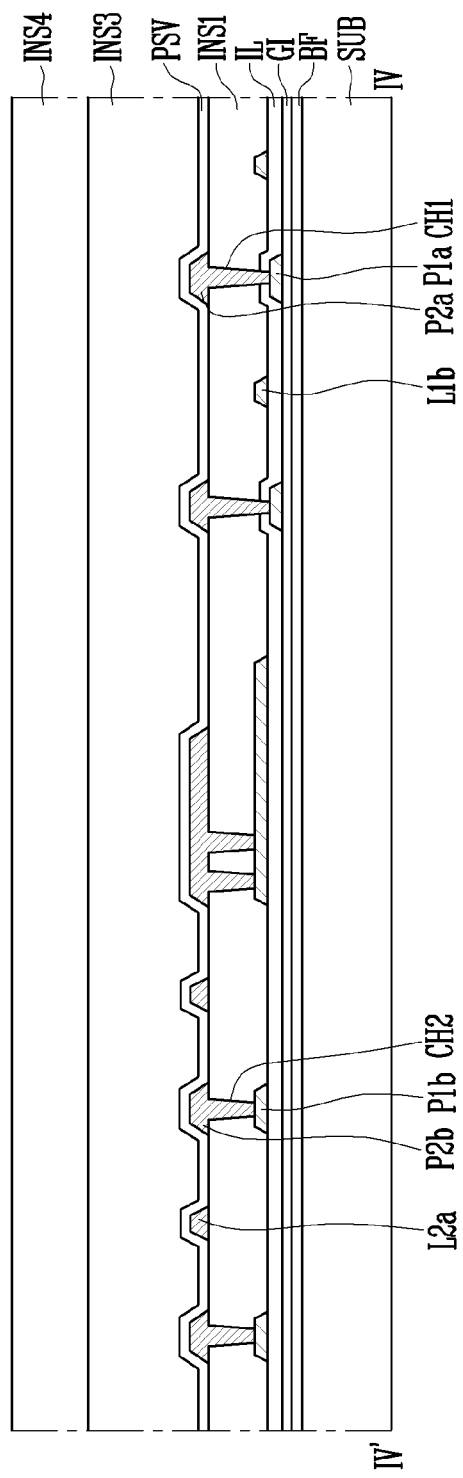
FIG. 15C is a cross sectional view taken along line IV-IV' of FIG. 14 according to exemplary embodiments of the inventive concept.

FIG. 13 is a cross sectional view taken along line I-I' of a display device of FIG. 1 according to an exemplary embodiment of the inventive concept. FIG. 14 is a plan view of a portion corresponding to A1 of a display device of FIG. 1 according to an exemplary embodiment of the inventive concept. FIG. 15A is a cross sectional view taken along line II-II' of FIG. 14, FIG. 15B is a cross sectional view taken along line III-III' of FIG. 14, and FIG. 15C is a cross sectional view taken along line IV-IV' of FIG. 14.

Referring to FIGS. 13, 14, and 15A to 15C, the line part LP may include the first lines L1 and the second lines L2. The first lines L1 and the second lines L2 may be connected to each other one to one.

The first lines L1 may include the first sub-lines L1a and the second sub-lines L1b. The first sub-lines L1a and the second sub-lines L1b may be alternately arranged along the first direction DR1. The first sub-lines L1a and the second sub-lines L1b have the first sub-pads P1a and the second sub-pads P1b, respectively, on end portions thereof. The first sub-pads P1a and the second sub-pads P1b may be formed to have different distances from the display area DA in the second direction DR2.

The first sub-lines L1a may be provided on the gate insulating layer GI with the gate electrode GE and the capacitor lower electrode LE of the display area DA. The first sub-lines L1a may be formed in the same process as the gate electrode GE and the capacitor lower electrode LE with substantially the same material.

The second sub-lines L1b may be provided on the insulating interlayer IL with the capacitor upper electrode UE of the display area DA. The second sub-lines L1b may be formed in the same process as the capacitor upper electrode UE with substantially the same material The second lines L2 may be provided on the first insulating layer INS1 and the second insulating layer INS2.

The second lines L2 and the first lines L1 may correspond one to one. When viewed in a plan view, the end portion of the first lines L1 and the end portion of the second lines L2 may overlap with each other. In other words, the first pads P1 of the first lines L1 and the second pads P2 of the second lines L2 may overlap with each other.

In a portion corresponding to the first sub-pads P1a of the first sub-lines L1a, the first contact hole CH1 penetrating the insulating interlayer IL and the first insulating layer INS1 may be provided. In a portion corresponding to the second sub-pads P1b of the second sub-lines L1b, the second contact hole CH2 penetrating the first insulating layer INS1 may be provided.

The third sub-lines L2a of the second lines L2 may correspond to the first sub-lines L1a and may be connected to the first sub-lines L1a through the contact hole CH1 penetrating the insulating interlayer IL and the first insulating layer INS1. The fourth sub-lines L2b of the second lines L2 may correspond to the second sub-lines L1b and may be connected to the second sub-lines L1b through the second contact hole CH2 penetrating the first insulating layer INS1. As a result, the first sub-pads P1a and the third sub-pads P2a may be electrically connected to each other and the second sub-pads P1b and the fourth sub-pad P2b may be electrically connected to each other.

When viewed in a plan view, the edge of the second insulating layer INS2 may be spaced apart from the display area DA with the overlapping portion of the first lines L1 and second lines L2 interposed between. In other words, the display area DA, the overlapping portion of the first lines L1 and the second lines L2, and the edge of the second insulating layer INS2 may be sequentially arranged along the second direction DR2. As such, the first sub-pads P1a and the third sub-pads P2a, the second sub-pads P1b and the fourth sub-pad P2b, and the edge of the second insulating layer INS2 may be sequentially arranged along the second direction DR2 from the display area DA. The edge of the second insulating layer INS2 are spaced apart a predetermined distance from the overlapping portion of the first lines L1 and the second lines L2. According to an exemplary embodiment of the inventive concept, the edge of the second insulating layer INS2 may be spaced apart from the ends of the second sub-pads P1b and the fourth sub-pads P2b by at least one micrometer.

Since the second insulating layer INS2 is spaced apart from the overlapping portion of the first lines L1 and the second lines L2, unlike the above described exemplary embodiments, in the positions in which the first sub-pads Pla and the third sub-pads P2a are formed and the second sub-pads P1b and the fourth sub-pads P2b are formed, a hole may not be formed that exposes the first sub-pads P1a and the third sub-pads P2a and exposes the second sub-pads P1b and the fourth sub-pads P2b.

In the present exemplary embodiment having the above-described structure, since the space between the edge of the second insulating layer INS2 and the overlapping portion of the first lines L1 and the second lines L2 is relatively narrow, shorts between lines may be reduced or prevented even though the metal residue may remain.

In the above exemplary embodiments, each embodiment may be combined with each other unless contrary to the spirit of the inventive concept. For example, according to an exemplary embodiment of the inventive concept, a portion of the exemplary embodiment illustrated in FIGS. 8 and 9A to 9C and a portion of the exemplary embodiment illustrated in FIGS. 13, 14, and 15A to 15C may be combined with each other. For example, as described with reference to FIGS. 13, 14, and 15A to 15C, the edge of the second insulating layer INS2 may be spaced apart from the display area DA with the overlapping portion of the first lines L1 and the second lines L2 in between. In other words, the display area DA, the overlapping portion of the first lines L1 and the second lines L2, and the edge of the second insulating layer INS2 may be placed in sequence along the second direction DR2. The second lines L2 may have the third sub-lines L2a corresponding to the first sub-lines L1a of the first lines L1 and the fourth sub-lines L2b corresponding to the second sub-lines L1b of the first lines L1. As described with reference to FIGS. 8 and 9A to 9C, the third sub-lines L2a and the fourth sub-lines L2b may be alternately arranged along the first direction DR1. The third sub-lines L2a and the fourth sub-lines L2b may be formed on different layers and may be alternately and sequentially arranged in the first direction DR1. Accordingly, a wide gap may be obtained between adjacent second lines L2, and the edge of the second insulating layer INS2 may be formed in an area away from the third sub-pads P2a and the fourth sub-pads P2b, so that the risk of a short may be greatly reduced when residue occurs.

The display device according to exemplary embodiments of the inventive concept may be employed in various types of electronic devices. For example, the display device may be applied to devices such as a television, a laptop, a mobile phone, a smart phone, a smart pad, a portable media player (PMP), a personal digital assistant (PDA), etc.

According to exemplary embodiments of the inventive concept, a defect such as a disconnection or short during the manufacturing process of the display device may be minimized Thus, a high quality display device may be provided.

While the inventive concept has been shown and described with reference to the exemplary embodiments thereof, it will be understood by those of ordinary skill in the art that various changes in form and details may be made thereto without departing from the spirit and scope of the present inventive concept as defined by the following claims.

What is claimed is:

1. A display device, comprising:
a substrate including a display area and a non-display area;
a plurality of pixels provided in the display area;
a first insulating layer disposed on the substrate and having a removed area in a bending area of the non-display area;
a second insulating layer overlapping with the removed area of the first insulating layer;
first lines provided on the substrate and connected to the plurality of pixels; and
second lines provided on the second insulating layer and connected to the first lines,
wherein an overlapping area in which the first lines overlap with the second lines is spaced apart from an edge of the second insulating layer when viewed perpendicularly to a major surface of the substrate, and
wherein the edge of the second insulating layer is disposed between the overlapping area and the display area.

2. The display device of claim 1, wherein the second insulating layer contacts the substrate in the removed area of the first insulating layer.

3. The display device of claim 1, wherein the first lines include first pads provided at an end of each first line, the second lines include second pads provided at an end of each second line, and the first pads and the second pads overlap with each other when viewed in a plan view.

4. The display device of claim 3, wherein the first insulating layer includes at least one contact hole in an area in which the first pads overlap with the second pads, and the first pads and the second pads are connected to each other through the at least one contact hole.

5. The display device of claim 4, wherein the second insulating layer has a hole to expose an upper surface of the first insulating layer in a position corresponding to the first and second pads when viewed in a plan view.

6. The display device of claim 5, wherein the hole is provided in a position corresponding to the at least one contact hole of the first insulating layer when viewed in a plan view.

7. The display device of claim 3, further comprising an insulating interlayer provided below the first insulating layer and having a removed area in the bending area of the non-display area, wherein the first lines include first sub-lines provided below the insulating interlayer and second sub-lines provided on the insulating interlayer.

8. The display device of claim 7, wherein the first sub-lines and the second sub-lines are alternately arranged when viewed in a plan view.

9. The display device of claim 7, further comprising a third insulating layer provided on the first and second insulating layers, wherein the second lines include third sub-lines provided on the first insulating layer and fourth sub-lines provided on the third insulating layer.

10. The display device of claim 9, wherein the third sub-lines and the fourth sub-lines are alternately arranged when viewed in a plan view.

11. The display device of claim 10, wherein the first sub-lines are connected to the third sub-lines, and the second sub-lines are connected to the fourth sub-lines.

12. The display device of claim 1, wherein the bending area is spaced apart from the display area.

13. The display device of claim 1, further comprising a third insulating layer provided on the first and second insulating layers, wherein the third insulating layer includes an opening of which a portion is removed along an edge of the display area.

14. The display device of claim 13, wherein each pixel comprises:
an active pattern provided on the substrate;
a gate insulating layer provided on the active pattern;
a gate electrode provided between the gate insulating layer and the first insulating layer;
a source electrode and a drain electrode provided on the first insulating layer;
a first electrode provided on the third insulating layer and connected to the drain electrode;
an organic layer provided on the first electrode; and
a second electrode provided on the organic layer.

15. The display device of claim 14, wherein at least a portion of the first lines is provided on the same layer and with substantially the same material as the gate electrode.

16. The display device of claim 14, wherein at least a portion of the second lines is provided on the same layer and with substantially the same material as the source electrode and the drain electrode.

17. A display device, comprising:
a substrate including a display area and a non-display area;
a plurality of pixels provided in the display area;
a first insulating layer having a removed area in a bending area of the non-display area;
a second insulating layer filling the removed area of the first insulating layer;
first lines provided on the substrate and connected to the plurality of pixels; and
second lines provided on the second insulating layer and connected to the first lines,
wherein an area in which the first lines overlap with the second lines is disposed closer to the display area than the second insulating layer when viewed perpendicularly to a major surface of the substrate.

18. A display device, comprising:
a substrate including a display area and a non-display area;
a plurality of pixels provided in the display area, each of the plurality of pixels having at least one transistor and a light emitting device connected to the at least one transistor;
a first insulating layer having a removed area in a bending area of the non-display area;

a second insulating layer filling the removed area of the first insulating layer;
first lines provided on the substrate and connected to the plurality of pixels; and
second lines provided on the second insulating layer and connected to the first lines,
wherein an area in which the first lines overlap with the second lines is spaced apart from an edge of the second insulating layer when viewed in a plan view,
wherein the at least one transistor includes an active pattern disposed on the substrate, a gate electrode disposed on the active pattern, and a source electrode and a drain electrode each connected to the active pattern,
wherein at least a portion of the first lines is provided on the same layer and with substantially the same material as the gate electrode, and
wherein at least a portion of the second lines is provided on the same layer and with substantially the same material as the source electrode and the drain electrode.

19. A display device, comprising:
a substrate including a display area and a non-display area;
a plurality of pixels provided in the display area;
a first insulating layer having a removed area in a bending area of the non-display area;
a second insulating layer filling the removed area of the first insulating layer;
first lines provided on the substrate and connected to the plurality of pixels; and
second lines provided on the second insulating layer and connected to the first lines,
wherein an area in which the first lines overlap with the second lines is spaced apart from an edge of the second insulating layer when viewed in a plan view,
wherein the first insulating layer comprises an inorganic material, and
wherein the second insulating layer comprises an organic material.

20. A display device, comprising:
a substrate including a display area to display an image and a non-display area provided on at least one side of the display area;
a plurality of pixels disposed on the substrate and provided in an area corresponding to the display area;
a first insulating layer having an opening in a first area of the non-display area;
a second insulating layer filling the opening of the first insulating layer, wherein the second insulating layer contacts the substrate in the opening of the first insulating layer;
first lines provided on the substrate and connected to the plurality of pixels; and
second lines provided on the second insulating layer and connected to the first lines,
wherein an area in which the first lines overlap with the second lines is spaced apart from an edge of the second insulating layer when viewed in a plan view.

* * * * *